(12) United States Patent
Fung

(10) Patent No.: US 11,282,748 B2
(45) Date of Patent: Mar. 22, 2022

(54) SEMICONDUCTOR DEVICE AND METHOD OF FORMING THE SAME

(71) Applicant: Taiwan Semiconductor Manufacturing Co., Ltd., Hsin-Chu (TW)

(72) Inventor: Ka-Hing Fung, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/926,165

(22) Filed: Jul. 10, 2020

(65) Prior Publication Data
US 2021/0098631 A1 Apr. 1, 2021

Related U.S. Application Data

(60) Provisional application No. 62/906,287, filed on Sep. 26, 2019.

(51) Int. Cl.
*H01L 21/8234* (2006.01)
*H01L 29/786* (2006.01)
*H01L 29/06* (2006.01)
(Continued)

(52) U.S. Cl.
CPC ........ *H01L 21/823431* (2013.01); *H01L 21/02532* (2013.01); *H01L 21/02603* (2013.01);
(Continued)

(58) Field of Classification Search
CPC ........ H01L 21/02532; H01L 21/02587; H01L 21/02603; H01L 21/30604; H01L 21/822; H01L 21/8232; H01L 21/823412; H01L 21/823431; H01L 21/8238; H01L 21/823807; H01L 21/823821; H01L 27/02; H01L 27/12; H01L 27/1203; H01L 27/1211; H01L 29/0669; H01L 29/0673;
(Continued)

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |

(Continued)

*Primary Examiner* — Cheung Lee
(74) *Attorney, Agent, or Firm* — Haynes and Boone, LLP

(57) ABSTRACT

An embodiment method includes: forming a dielectric-containing substrate over a semiconductor substrate; forming a stack of first semiconductor layers and second semiconductor layers over the dielectric-containing substrate, wherein the first semiconductor layers and the second semiconductor layers have different material compositions and alternate with one another within the stack; patterning the first semiconductor layer and the second semiconductor layers into a fin structure such that the fin structure includes sacrificial layers including the second semiconductor layers and channel layers including the first semiconductor layers; forming source/drain features adjacent to the sacrificial layers and the channel layers; removing the sacrificial layers of the fin structure so that the channel layers of the fin structure are exposed; and forming a gate structure around the exposed channel layers, wherein the dielectric-containing substrate is interposed between the gate structure and the semiconductor substrate.

20 Claims, 24 Drawing Sheets

(51) Int. Cl.
*H01L 29/423* (2006.01)
*H01L 29/66* (2006.01)
*H01L 21/02* (2006.01)
*H01L 21/306* (2006.01)

(52) U.S. Cl.
CPC .... *H01L 21/30604* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78603* (2013.01); *H01L 29/78618* (2013.01); *H01L 29/78696* (2013.01)

(58) Field of Classification Search
CPC ............... H01L 29/401; H01L 29/4232; H01L 29/42392; H01L 29/66477; H01L 29/66545; H01L 29/66553; H01L 29/66742; H01L 29/78; H01L 29/78603; H01L 29/78618; H01L 29/78696
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2018/0090624 A1* | 3/2018 | Cheng ............... H01L 29/66742 |

* cited by examiner

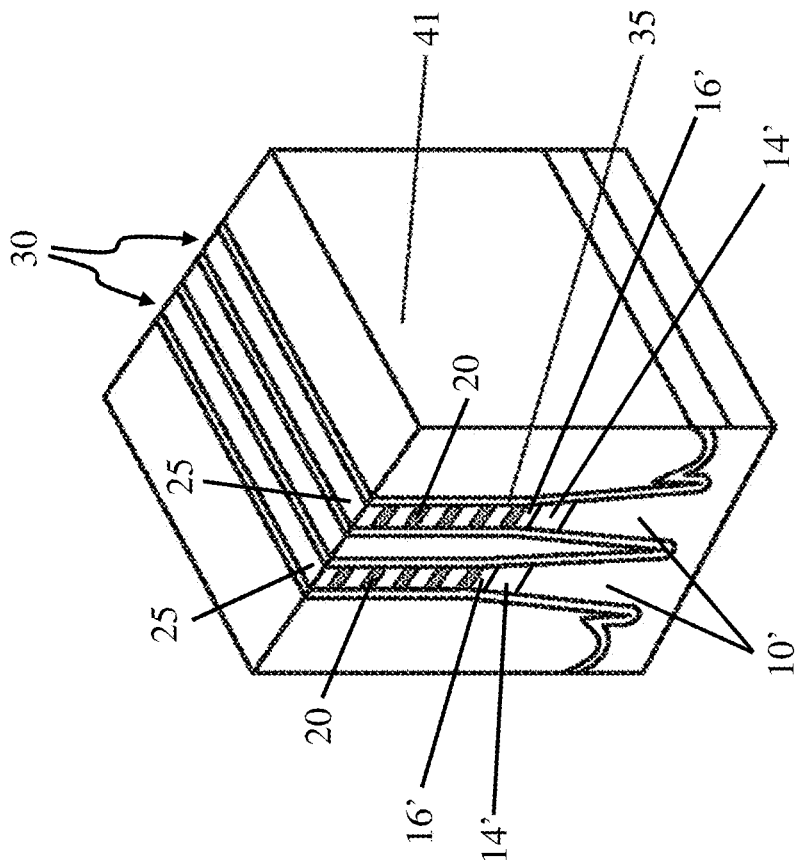
FIGURE 6
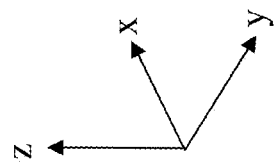

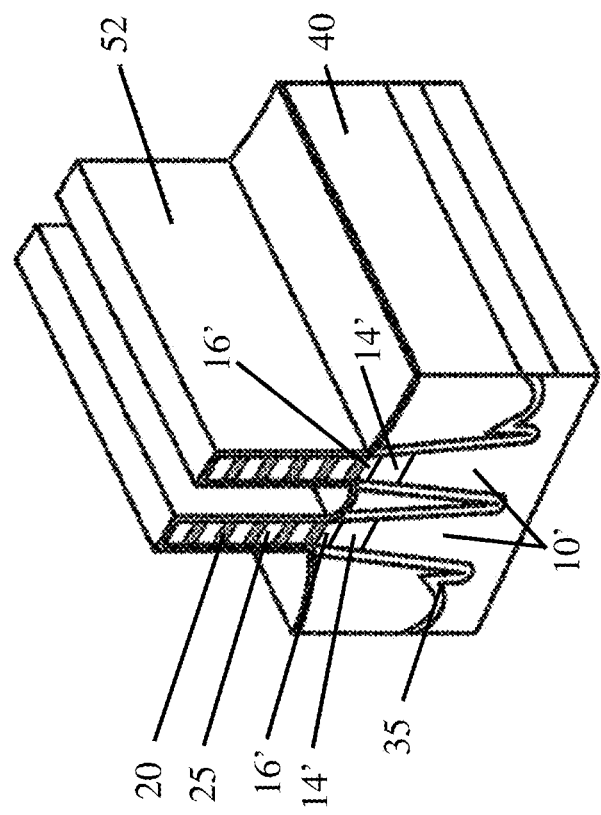
FIGURE 8
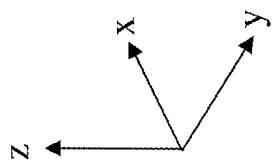

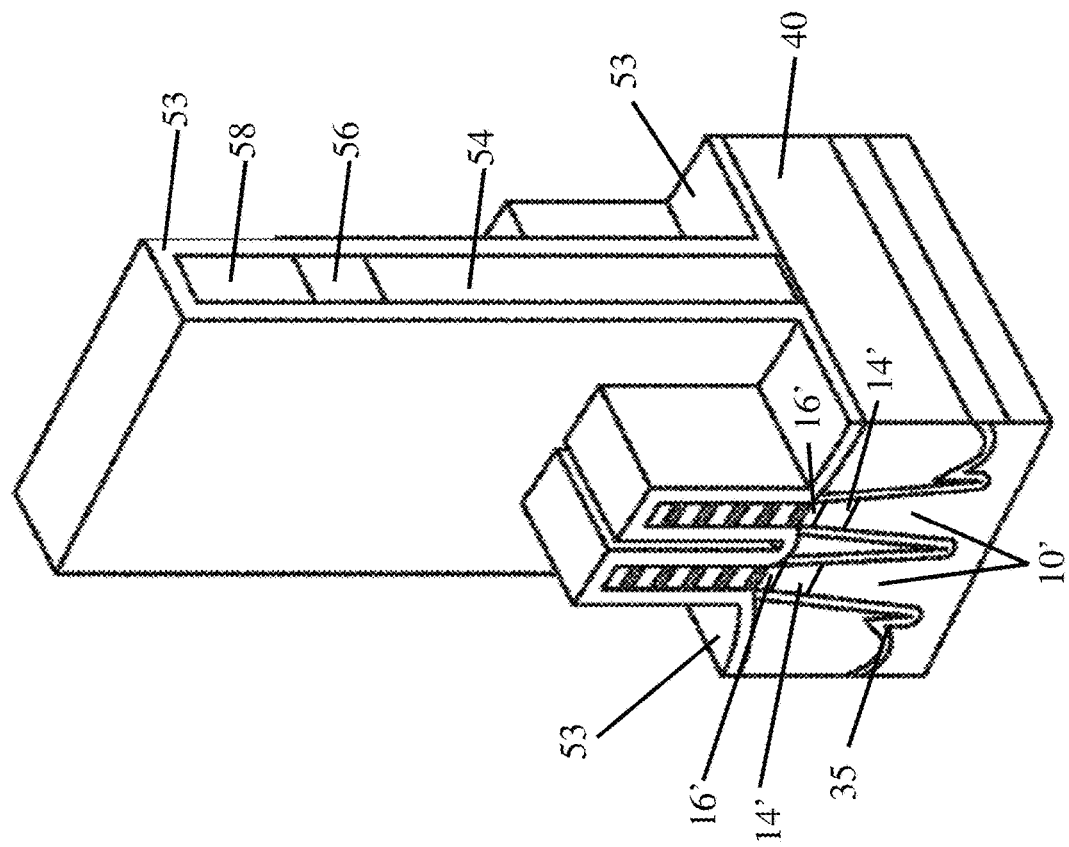
FIGURE 10
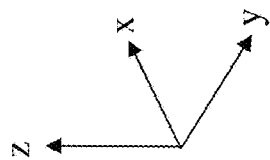

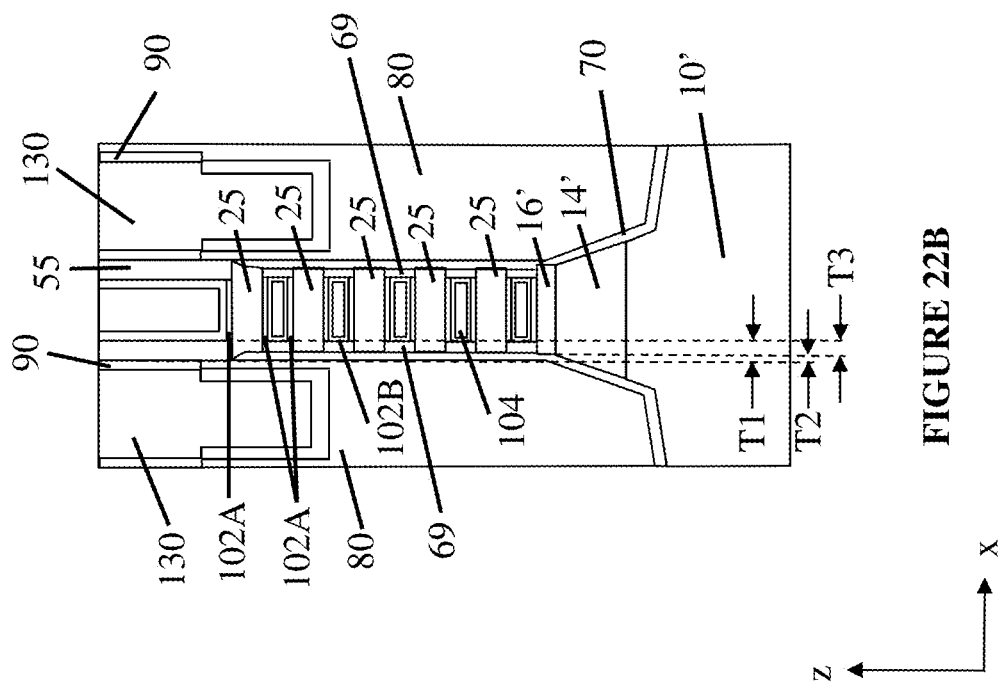
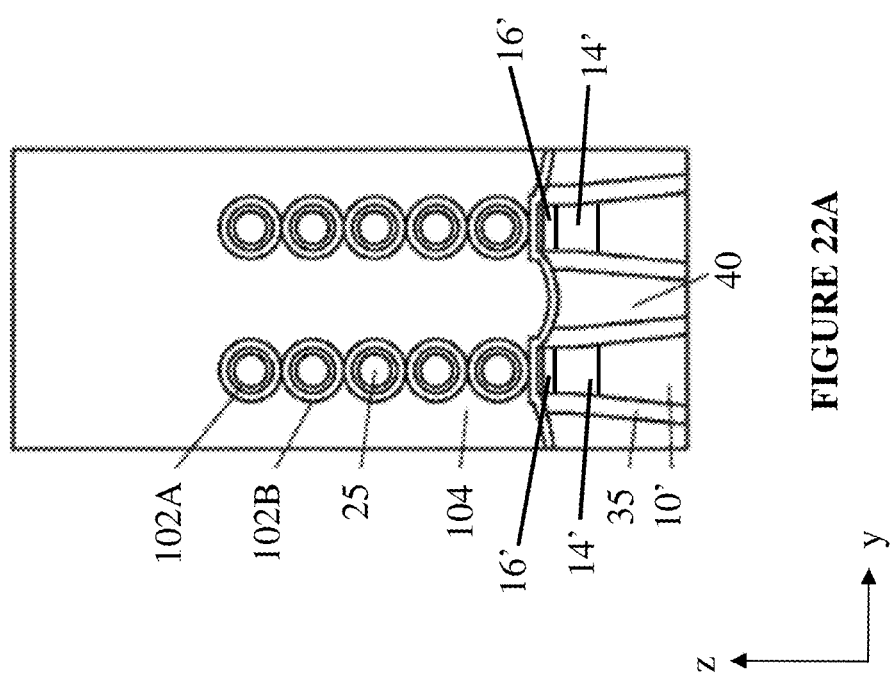
FIGURE 22A
FIGURE 22B

SEMICONDUCTOR DEVICE AND METHOD OF FORMING THE SAME

PRIORITY DATA

This application claims priority to U.S. Provisional Patent Application Ser. No. 62/906,287, filed Sep. 26, 2019 and entitled "Structure and Method for Semiconductor Devices," which application is hereby incorporated by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin-like FET (FinFET) and a gate-all-around (GAA) FET. In a FinFET device, a gate electrode is adjacent to three side surfaces (e.g. vertical sidewalls and a top surface) of a channel region, with a gate dielectric layer interposed therebetween. Because the gate structure surrounds (wraps) the fin on three surfaces, the transistor essentially has three gates controlling the current through the fin or channel region. The fourth side, namely the bottom part of the channel, is essentially not under gate control. In contrast, in a GAA FET, semiconductor layers of the channel region are surrounded on all sides by the gate electrode, which allows for fuller depletion in the channel region, thereby resulting in less short-channel effects due to steeper sub-threshold current swing and smaller drain induced barrier lowering. As transistor dimensions are continually scaled down, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1 to 22C show exemplary sequential processes for manufacturing a gate-all-around (GAA) field effect transistor (FET) device, according to an embodiment of the present disclosure;

DETAILED DESCRIPTION

Figure 2:
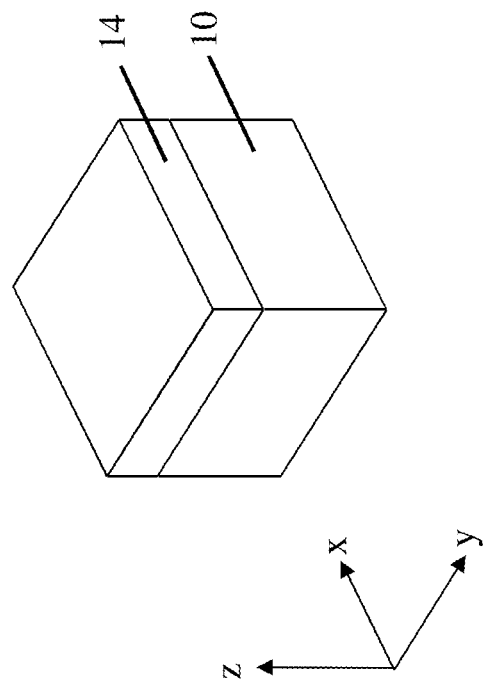

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a multi-gate field effect transistor (FET), an example being a gate-all-around (GAA) FET. In a GAA FET, a plurality of semiconductor channel layers are vertically suspended over an underlying semiconductor substrate. A gate structure (including a gate electrode layer and a gate dielectric layer) is formed in the space between vertically adjacent semiconductor channel layers. Embodiments of the present disclosure provide for at least one insulating layer that is interposed between the bottommost gate structure and the underlying semiconductor substrate, where the bottommost gate structure is the gate structure in closest proximity to the underlying semiconductor substrate. The presence of the at least one insulating layer between the bottommost gate structure and the underlying semiconductor substrate reduces leakage current in the GAA FET, minimizes a size of a parasitic PN junction between the semiconductor substrate and the source/drain regions of the GAA FET, and improves the $I_{ON}/I_{OFF}$ ratio of the GAA FET.

FIGS. 1 to 22C show exemplary sequential processes for manufacturing the GAA FET device according to one embodiment of the present disclosure. It is understood that additional operations can be provided before, during, and after processes shown by FIGS. 1 to 22C, and some of the operations described below can be replaced or eliminated, for additional embodiments of the method. The order of the operations/processes may be interchangeable.

Figure 1:
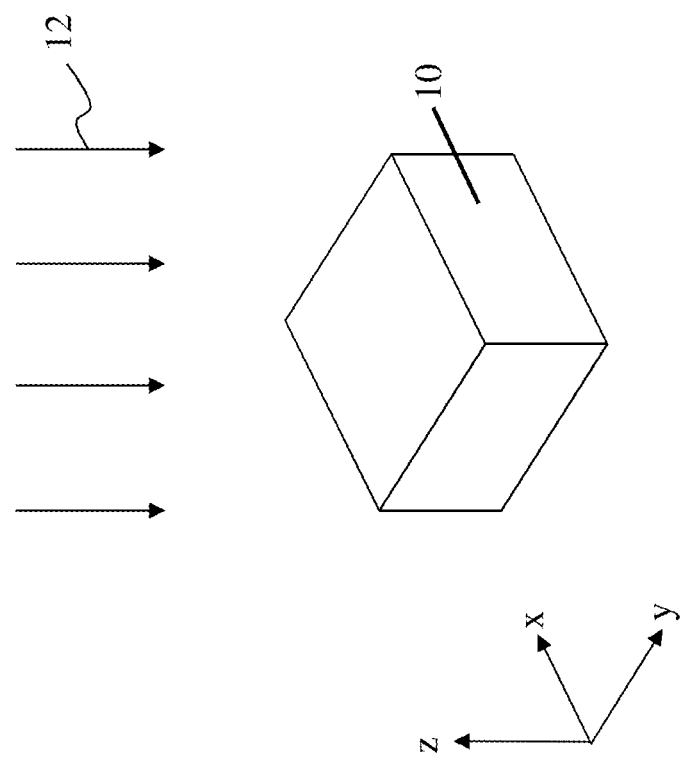

FIG. 1 illustrates a semiconductor substrate 10 subjected to an implantation process, whereby impurity ions 12 (also referred to as "dopants") are implanted into the semiconductor substrate 10 to form a well region. The well region may be an N-well region or a P-well region. The ion implantation may be performed to prevent a punch-through effect. In one embodiment, semiconductor substrate 10 includes a single crystalline semiconductor layer on at least a surface portion. The semiconductor substrate 10 may include a single crystalline semiconductor material such as, but not limited to Si, Ge, SiGe, GaAs, InSb, GaP, GaSb, InAlAs, InGaAs, GaSbP, GaAsSb and InP. In this embodiment, the semiconductor substrate 10 includes Si.

The semiconductor substrate 10 may include one or more buffer layers (not shown) in its surface region. The buffer layers can serve to gradually change the lattice constant from that of the semiconductor substrate to that of the source/drain regions. The buffer layers may be formed from epitaxially grown single crystalline semiconductor materials such as (but not limited to) Si, Ge, GeSn, SiGe, GaAs, InSb, GaP, GaSb, InAlAs, InGaAs, GaSbP, GaAsSb, GaN, GaP, and InP. In a particular embodiment, the semiconductor substrate 10 includes silicon germanium (SiGe) buffer layers epitaxially grown on the semiconductor substrate 10. The germanium concentration of the SiGe buffer layers may increase from 30 atomic % germanium for the bottom-most buffer layer to 70 atomic % germanium for the top-most buffer layer. The semiconductor substrate 10 may include various regions that have been suitably doped with impurities (e.g., p-type or n-type conductivity). The dopants 12 are, for example boron ($BF_2$) for an n-type Fin FET and phosphorus (P) for a p-type Fin FET.

In FIG. 2, an insulating layer 14 is formed over (e.g., directly on) the semiconductor substrate 10. The insulating layer 14 includes, or may be, an electrically-insulative material, examples being silicon oxide, silicon nitride, silicon oxynitride (SiON), SiOCN, SiCN, fluorine-doped silicate glass (FSG), or a low-K dielectric material. The insulating layer 14 is formed over the semiconductor substrate 10 by LPCVD (low pressure chemical vapor deposition), plasma-CVD or flowable CVD.

Figure 3:
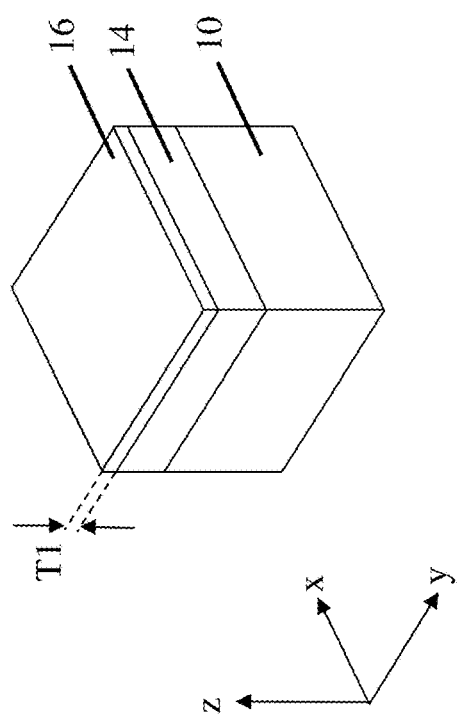
Figure 9:
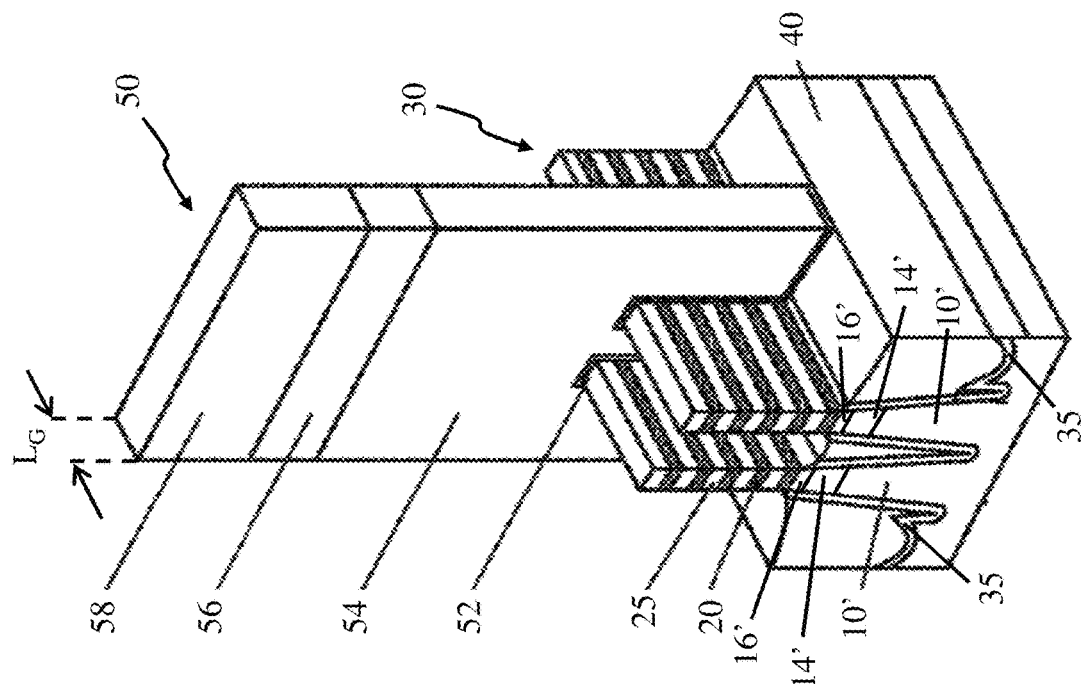

In FIG. 3, a semiconductor-containing layer 16 is formed over (e.g., directly on) the insulating layer 14. The semiconductor-containing layer 16 may have a composition that is different from the insulating layer 14. As an example, the semiconductor-containing layer 16 may be a semiconductor-on-insulator (SOI) substrate (e.g., a fully-depleted SOI substrate or a partially-depleted SOI substrate) including a layer of a semiconductor material (e.g., silicon) formed on an insulator layer. The insulator layer of the semiconductor-containing layer 16 may, for example, be a buried oxide (BOX) layer, a silicon oxide layer, or the like. The semiconductor material of the semiconductor-containing layer 16 may be undoped in some embodiments. In other embodiments, however, the semiconductor material may be doped to have a conductivity type that is different from channel layers that are subsequently formed over the semiconductor-containing layer 16 (e.g. second semiconductor layers 25 described below in reference to FIG. 4). In some embodiments, a thickness T1 of the semiconductor-containing layer 16 (e.g., as measured in the Z direction) may be in a range from about 0.4 times the gate length of the transistor device to about 0.6 times the gate length of the transistor device (e.g. about 0.5 times the gate length of the transistor device). The gate length is illustrated in FIG. 9 as length LG. As an example, the thickness T1 of the semiconductor-containing layer 16 may be in a range from about 3 nanometers to about 7 nanometers (e.g. about 5 nanometers) in order to achieve high device performance, such as higher current and higher current speed.

Figure 4:
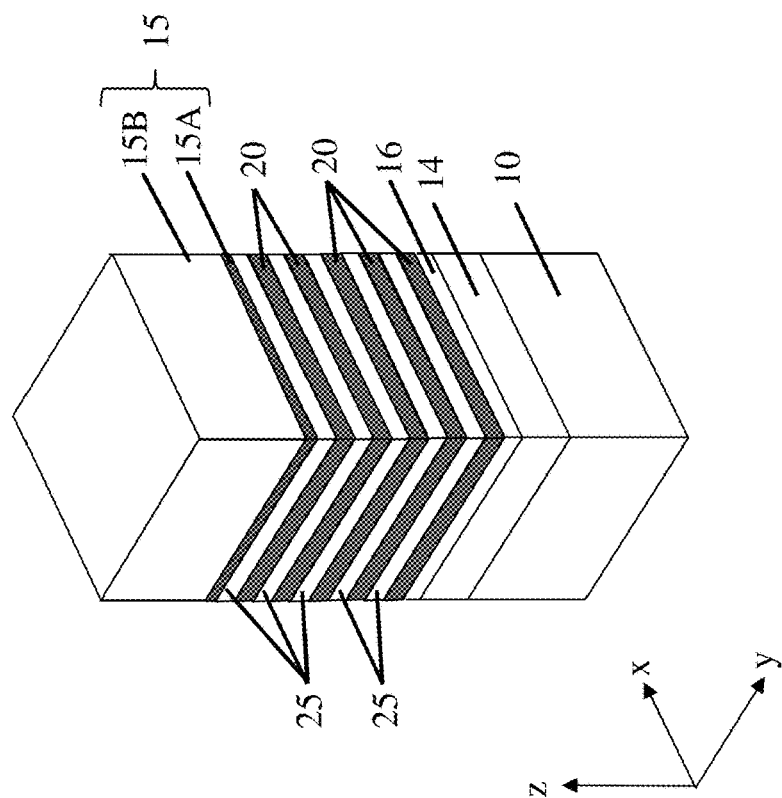

In FIG. 4, a stack of semiconductor layers is formed over the semiconductor-containing layer 16 in an interleaving or alternating fashion. The stack of semiconductor layers extend vertically (e.g. along the Z direction) from the semiconductor-containing layer 16. For example, a first semiconductor layer 20 is disposed over the semiconductor-containing layer 16, a second semiconductor layer 25 is disposed over the first semiconductor layer 20, another first semiconductor layer 20 is disposed over the second semiconductor layer 25, and so on and so forth. Further, a mask layer 15 is formed over the stacked layers. The first semiconductor layers 20 and the second semiconductor layers 25 include materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 include Si, a Si compound, SiGe, Ge, or a Ge compound. In one embodiment, the first semiconductor layers 20 include $Si_{(1-x)}Ge_x$, where x is more than about 0.3. For example, when x=1.0, the first semiconductor layers 20 includes Ge. The second semiconductor layers 25 includes Si or $Si_{(1-y)}Ge_y$, where y is less than about 0.4, and x>y.

In another embodiment, the second semiconductor layers 25 includes $Si_{(1-y)}Ge_y$, where y is more than about 0.3, and in such an embodiment, the first semiconductor layers 20 include Si or $Si_{(1-x)}Ge_x$, where x is less than about 0.4, and x<y. In yet other embodiments, the first semiconductor layer 20 includes $Si_{(1-x)}Ge_x$, where x is in a range from about 0.3 to about 0.8, and the second semiconductor layer 25 includes $Si_{(1-x)}Ge_x$, where x is in a range from about 0.1 to about 0.4.

In FIG. 4, five layers of the first semiconductor layer 20 and five layers of the second semiconductor layer 25 are shown. However, the number of first semiconductor layers 20 and/or the number of second semiconductor layers 25 are not limited to five and may be as small as 1 and, in some embodiments, 2 to 10 layers of each of the first and second semiconductor layers. It is noted that the first semiconductor layers 20 are sacrificial layers which are subsequently partially removed, and the second semiconductor layers 25 are subsequently formed into channel layers of a GAA FET. By adjusting the numbers of the stacked layers, a driving current of the GAA FET device can be adjusted. It is once again noted that in some embodiments, the second semiconductor layers 25 may be doped to have a conductivity type that is different from the semiconductor material of the underlying semiconductor-containing substrate 16.

The bottom first semiconductor layer 20 (e.g., the first semiconductor layer 20 closest to the semiconductor-containing layer 16 in the Z direction and/or in physical contact with the semiconductor-containing layer 16) is epitaxially formed over the semiconductor-containing layer 16. The bottom second semiconductor layer 25 (e.g., the second semiconductor layer 25 closest to the bottom first semiconductor layer 20 in the Z direction and/or in physical contact with the bottom first semiconductor layer 20) is epitaxially formed over the bottom first semiconductor layer 20. This epitaxial process is repeated to form the stacked semiconductor layers 20, 25 shown in FIG. 4. The thickness of each of the first semiconductor layers 20 may be the same or may vary. The thickness of the first semiconductor layers 20 may be equal to or greater than that of the second semiconductor layers 25. In some embodiments, the thickness of each of the first semiconductor layers 20 is in a range from about 5 nm to about 50 nm. In other embodiments, the thickness of each of the first semiconductor layers 20 is in a range from about 10 nm to about 30 nm. The thickness of the second semiconductor layers 25 is in a range from about 5 nm to about 30 nm in some embodiments and is in a range from about 10 nm to about 20 nm in other embodiments. In some embodiments, the bottom first semiconductor layer 20 is thicker than the remaining first semiconductor layers 20. In such embodiments, the thickness of the bottom first semiconductor layer 20 is in a range from about 10 nm to about 50 nm (e.g. in a range from about 20 nm to about 40 nm).

In some embodiments, the mask layer 15 includes a first mask layer 15A and a second mask layer 15B. The first mask layer 15A may be a pad oxide layer including silicon oxide, which may be formed by a thermal oxidation. The second mask layer 15B may include a material different from the first mask layer 15A. As an example, the second mask layer 15B may include silicon nitride (SiN), which may be formed by chemical vapor deposition (CVD), low pressure CVD (LPCVD), plasma enhanced CVD (PECVD), physical vapor deposition (PVD), atomic layer deposition (ALD), or other suitable process. The mask layer 15 is patterned using patterning operations including photo-lithography and etching. It is noted that in some embodiments, at least one of the first mask layer 15A or the second mask layer 15B may include a light-absorbing material.

Figure 5:
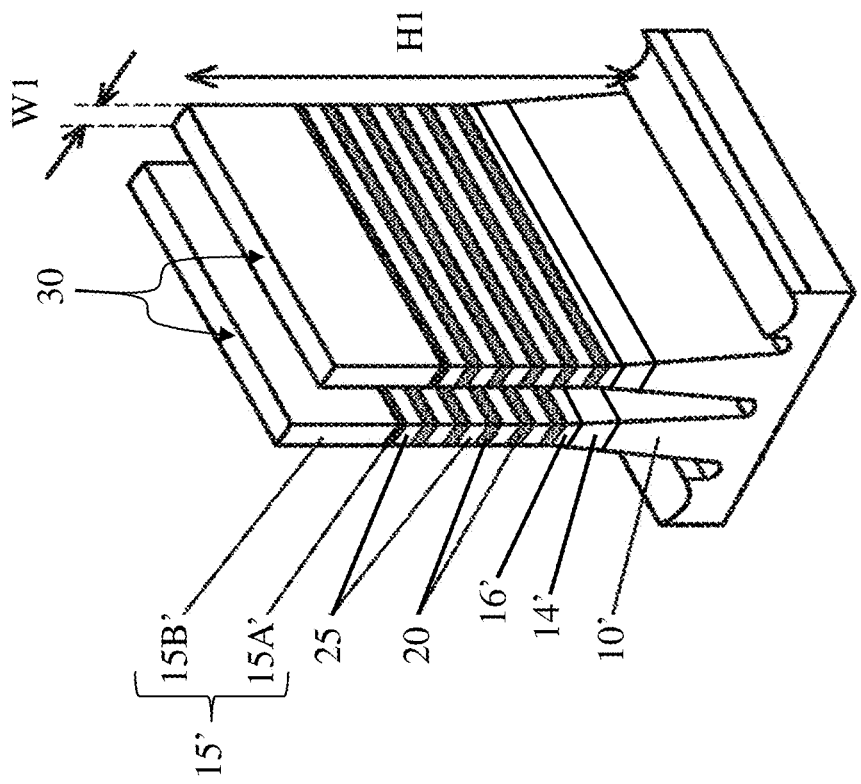

Next, as shown in FIG. 5, the stacked layers of the first and second semiconductor layers 20, 25 are patterned. As an example, the mask layer 15 is patterned thereby forming a patterned mask layer 15'. The pattern of the patterned mask layer 15' is subsequently transferred to the stacked layers of the first and second semiconductor layers 20, 25, thereby forming fin structures 30 extending longitudinally in the X direction. In some embodiments, an anisotropic etching process is used to form the fin structures 30. In the example of FIG. 5, the fin structures 30 are separated from each other laterally in the Y direction. It is noted that the number of the fin structures is not limited to two and may be as small as one or may be three or more. In some embodiments, one or more dummy fin structures are formed on one or both sides of the fin structures 30 to improve pattern fidelity in the patterning operations.

As shown in FIG. 5, the fin structures 30 have portions formed by the stacked semiconductor layers 20, 25, the patterned semiconductor-containing layer 16', the patterned insulating layer 14', and the well portions 10'. It is noted that the well portions 10' are formed by patterning the semiconductor substrate 10 (e.g., by transferring the pattern of the patterned mask layer 15' to the semiconductor substrate 10). A width W1 of an upper portion of the fin structure 30 (e.g., measured along the Y direction) may be in a range from about 10 nm to about 40 nm (e.g., in a range from about 20 nm to about 30 nm). A height H1 of the fin structure 30 (e.g., measured along the Z direction) may be in a range from about 100 nm to about 200 nm.

Referring to FIG. 6, after the fin structures 30 are formed, an insulating material layer 41 (e.g., including one or more layers of insulating material) is formed over the semiconductor substrate 10 so that the fin structures 30 are embedded in the insulating layer 41. The material of the insulating layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD (e.g. global CVD). One or more anneal operations may be performed after forming the insulating layer 41 (e.g. to drive out free carbon and/or free nitrogen present in the material of the insulating layer 41). Subsequently, a planarization operation, such as a chemical mechanical polishing (CMP) process and/or an etch-back method, is performed such that the upper surface of the uppermost second semiconductor layer 25 is exposed, as shown in FIG. 6. In some embodiments, a first liner layer 35 is formed over the structure of FIG. 5 before forming the insulating material layer 41. The first liner layer 35 includes SiN or a silicon nitride-based material (e.g., SiON, SiCN, or SiOCN).

Figure 7:
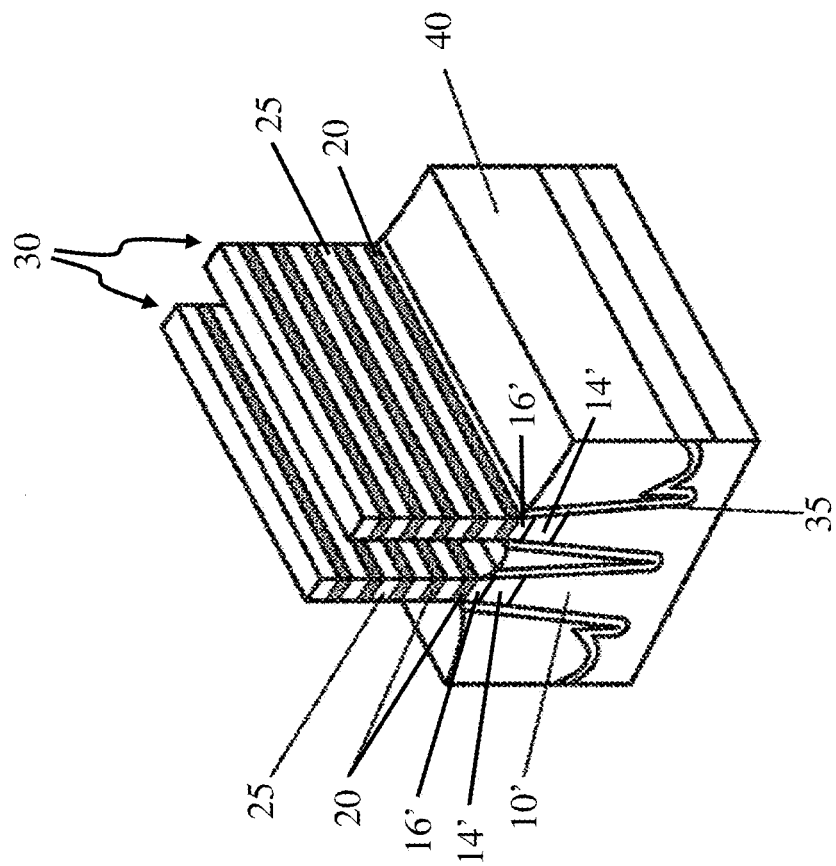
Figure 7:
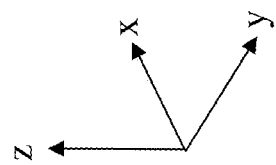

Referring to FIG. 7, the insulating material layer 41 is subsequently recessed to form an isolation insulating layer 40 so that upper portions of the fin structures 30 are exposed. With this operation, the fin structures 30 are electrically separated from each other by the isolation insulating layer 40, which may also be referred to as a shallow trench isolation (STI). In the embodiment shown in FIG. 7, the insulating material layer 41 is recessed until the bottommost first semiconductor layer 20 is exposed. In other embodiments, at least the upper portion of the patterned semiconductor-containing layer 16' is also exposed. In the example shown in FIG. 7, the first liner layer 35 is also recessed in order to expose the upper portions of the fin structures 30.

After the isolation insulating layer 40 is formed, a sacrificial gate dielectric layer 52 is formed, as shown in FIG. 8. The sacrificial gate dielectric layer 52 may be a conformal layer and may include one or more layers of insulating material, such as a silicon oxide-based material. In one embodiment, the sacrificial gate dielectric layer 52 includes silicon oxide, which may be formed by CVD. The thickness of the sacrificial gate dielectric layer 52 may be in a range from about 1 nm to about 5 nm in some embodiments.

FIG. 9 illustrates a structure after a sacrificial gate structure 50 is formed over the fin structures 30. The sacrificial gate structure 50 includes a sacrificial gate electrode 54 and the sacrificial gate dielectric layer 52. The sacrificial gate structure 50 is formed over a portion of the fin structure which is to be a channel region. The sacrificial gate structure 50 defines the channel region of the GAA FET. The gate length described above in relation to the thickness T1 of the semiconductor-containing layer 16' is shown in FIG. 9 as length LG.

The sacrificial gate structure 50 is formed by first blanket depositing the sacrificial gate dielectric layer 52 over the fin structures, as shown in FIG. 8. A sacrificial gate electrode layer 54 is then blanket deposited on the sacrificial gate dielectric layer 52 and over the fin structures 30, such that the fin structures 30 are fully embedded in the sacrificial gate electrode layer 54. The sacrificial gate electrode layer 54 includes silicon, for example polycrystalline silicon or amorphous silicon. The thickness of the sacrificial gate electrode layer 54 may be in a range from about 100 nm to about 200 nm in some embodiments. In some embodiments, the sacrificial gate electrode layer 54 is subjected to a planarization operation. The sacrificial gate dielectric layer 52 and the sacrificial gate electrode layer 54 are deposited using CVD, including LPCVD and PECVD, PVD, ALD, or other suitable process. Subsequently, a mask layer is formed over the sacrificial gate electrode layer 54. The mask layer includes a pad SiN layer 56 and a silicon oxide mask layer 58 disposed over the pad SiN layer 56.

Next, a patterning operation is performed on the mask layer. The pattern of the mask layer is transferred to the sacrificial gate electrode layer 54 to form the sacrificial gate structure 50, as shown in FIG. 9. The sacrificial gate structure 50 includes the sacrificial gate dielectric layer 52, the sacrificial gate electrode layer 54 (e.g., poly silicon), the pad SiN layer 56, and the silicon oxide mask layer 58. By patterning the sacrificial gate structure, the stacked layers of the first and second semiconductor layers are partially exposed on opposite sides of the sacrificial gate structure 50, thereby defining source/drain (S/D) regions, as shown in FIG. 9. In this disclosure, the terms "source" and "drain" are interchangeably used and the structures thereof are substantially the same. In FIG. 9, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

After the sacrificial gate structure is formed, a blanket layer 53 of an insulating material is conformally formed by using CVD or other suitable methods, as shown in FIG. 10. The blanket layer 53 is subsequently patterned to form sidewall spacers 55 (see FIG. 11A, 11C). The blanket layer 53 is deposited in a conformal manner so that it is formed to have substantially equal thicknesses on vertical surfaces, such as the sidewalls, horizontal surfaces, and the top of the sacrificial gate structure 50. In some embodiments, the blanket layer 53 is deposited to have a thickness in a range from about 2 nm to about 10 nm. In one embodiment, the insulating material of the blanket layer 53 is a silicon nitride-based material, such as SiN, SiON, SiOCN or SiCN and combinations thereof.

Figure 11A:
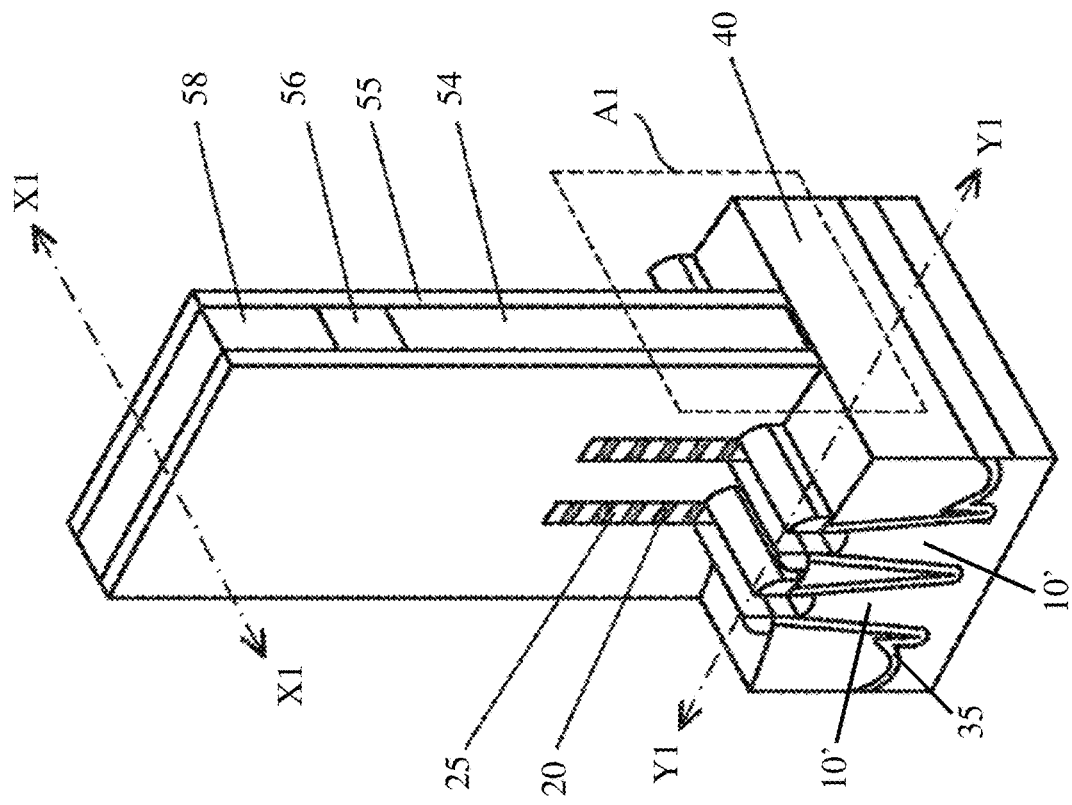
Figure 11C:
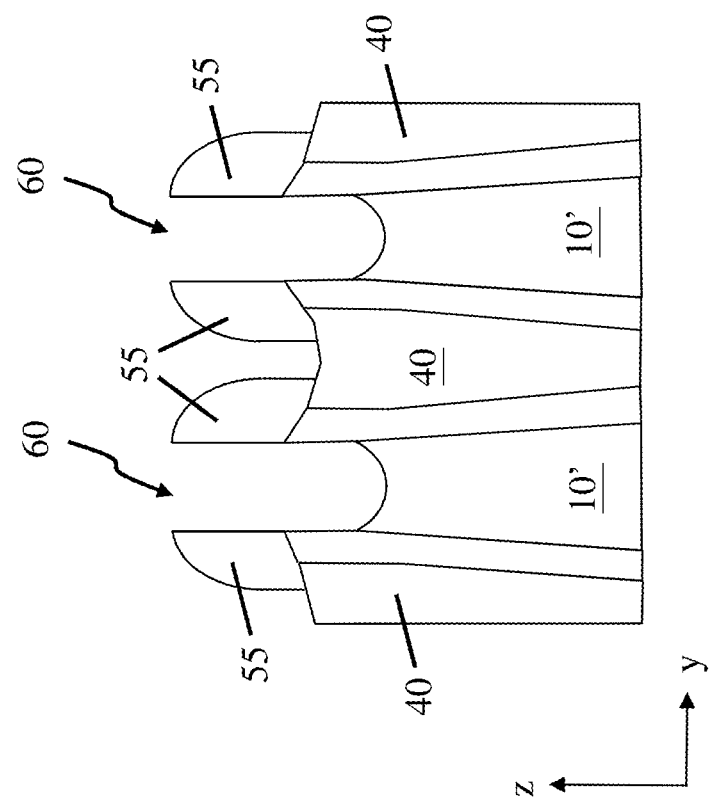
Figure 11B:
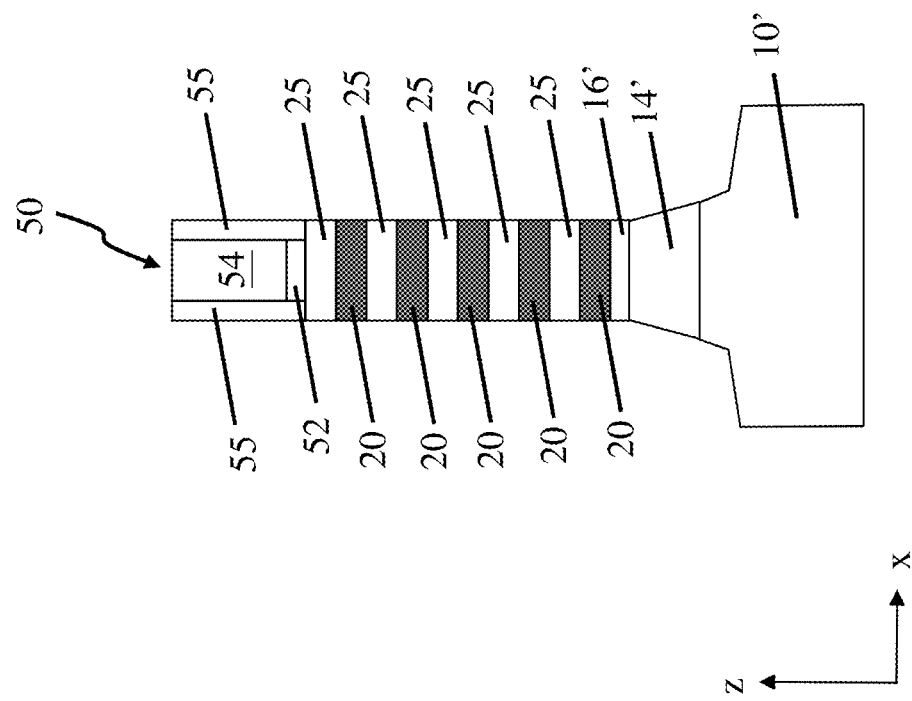

As shown in FIGS. 11A-11C, sidewall spacers 55 are formed on opposite sidewalls of the sacrificial gate structure 50, and subsequently, the fin structures of the S/D regions are recessed down below the upper surface of the isolation insulating layer 40. FIG. 11B is the cross-sectional view corresponding to area A1 and line X1-X1 of FIG. 11A, and FIG. 11C is the cross-sectional view corresponding to line Y1-Y1 of FIG. 11A. In FIG. 11B, the cross section of the bottom part of sacrificial gate structure 50 is illustrated.

After the blanket layer 53 is formed (e.g. as shown in FIG. 10), etching (e.g. anisotropic etching) is performed on the blanket layer 53 using, for example, reactive ion etching (RIE). During the etching process, most of the insulating material is removed from horizontal surfaces, leaving the dielectric spacer layer on the vertical surfaces such as the sidewalls of the sacrificial gate structure 50 and the sidewalls of the exposed fin structures. The mask layer 58 may be exposed from the sidewall spacers. In some embodiments, isotropic etching may be performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIGS. 11A and 11C, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure 50 have substantially flat faces which are flush with the sidewall spacers 55, as shown in FIG. 11B. In some embodiments, the end portions of the stacked layer of the first and second semiconductor layers 20, 25 are slightly horizontally etched.

Figure 12A:
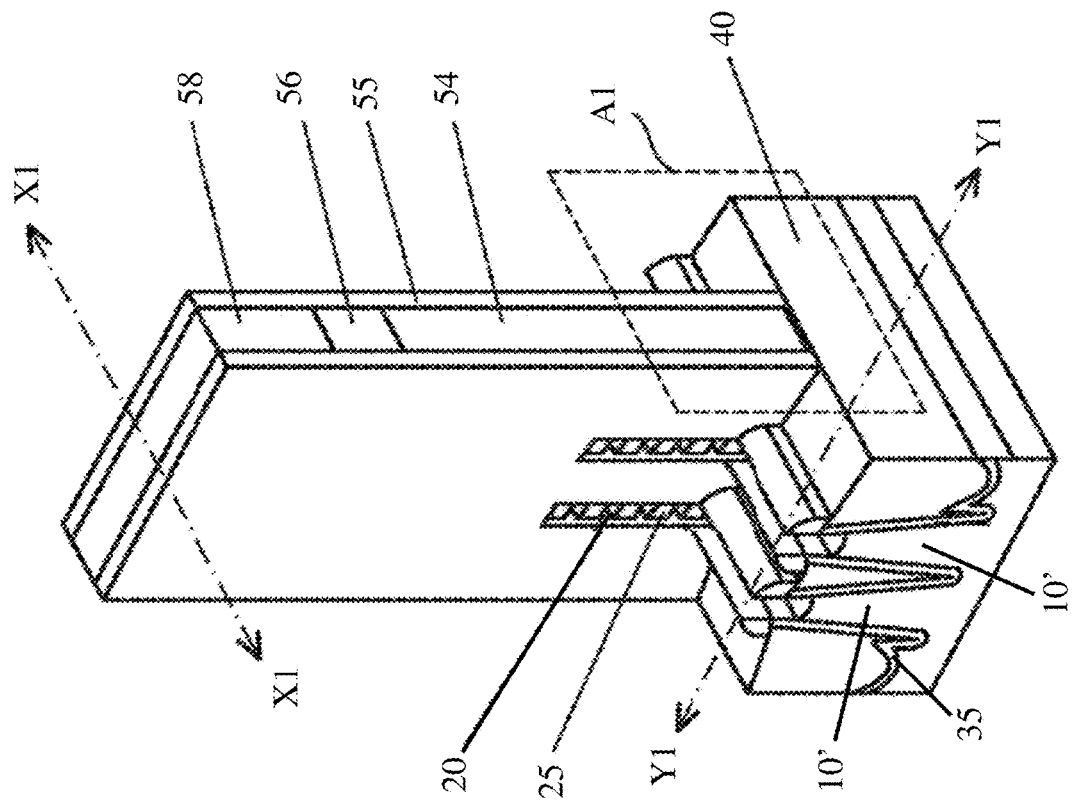
Figure 12A:
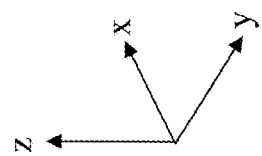
Figure 12C:
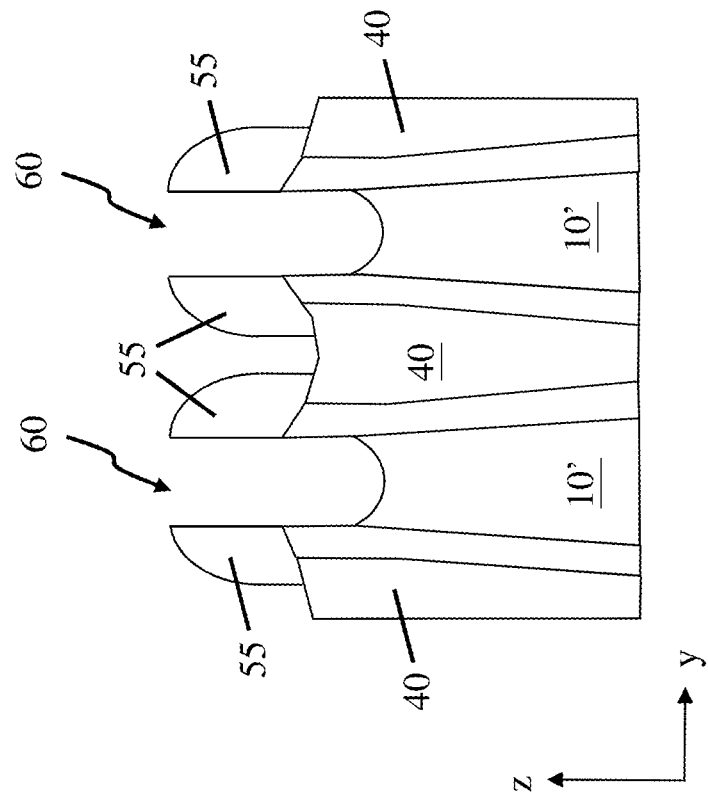
Figure 12B:
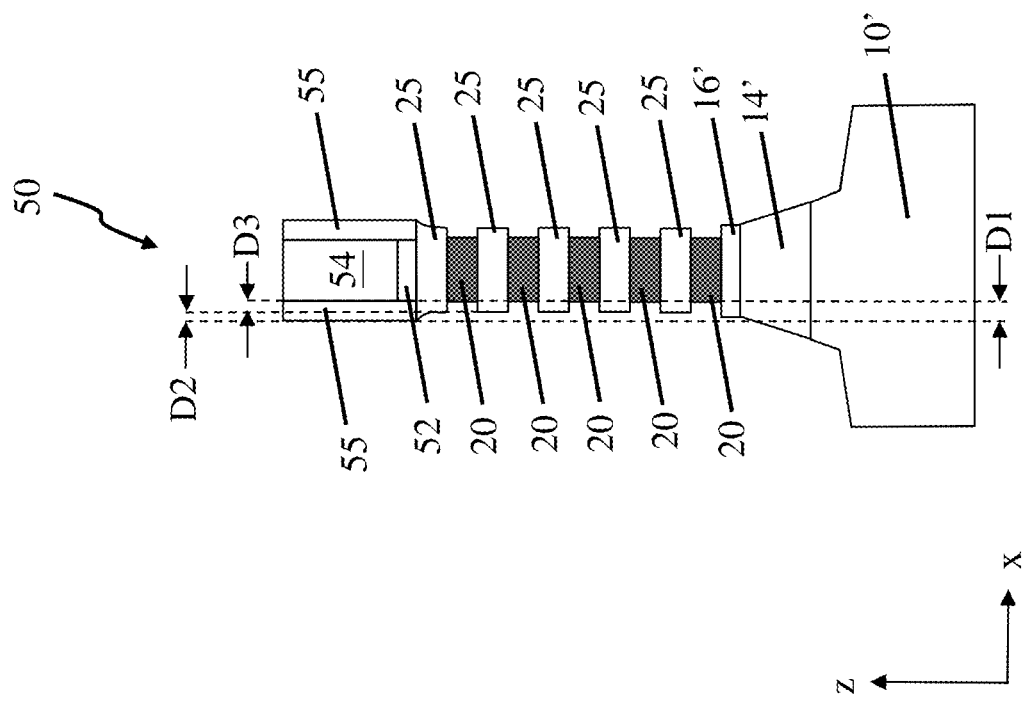

Subsequently, as shown in FIGS. 12A-12C, the first semiconductor layers 20 are horizontally recessed (e.g. etched) so that edges of the first semiconductor layers 20 are located substantially below a side face of the sacrificial gate electrode layer 54. As shown in FIG. 12B, end portions (e.g. edges) of the first semiconductor layers 20 under the sacrificial gate structure are substantially aligned with the side faces of the sacrificial gate electrode layer 54.

During the recess etching of the first semiconductor layers 20 and/or the recess etching of the first and second semiconductor layers as described with FIGS. 11A-11C, end portions of the second semiconductor layers 25 are also horizontally etched, as shown in FIG. 12B. The recessed amount of the first semiconductor layers 20 is greater than the recessed amount of the second semiconductor layers 25.

The depth D1 of the recessing of the first semiconductor layers 20 from the plane including one sidewall spacer is in a range from about 5 nm to about 10 nm, the depth D2 of the recessing of the second semiconductor layers 25 from the plane including one sidewall spacer is in a range from about 1 nm to about 4 nm, in some embodiments. The difference D3 of the depth D1 and the depth D2 is in a range from about 1 nm to about 9 nm, in some embodiments. It is noted that in certain embodiments, the etching (horizontally recessing) the first and second semiconductor layers is not performed. In other embodiments, the amounts of etching of the first and second semiconductor layers are substantially the same (difference is less than about 0.5 nm).

Figure 13A:
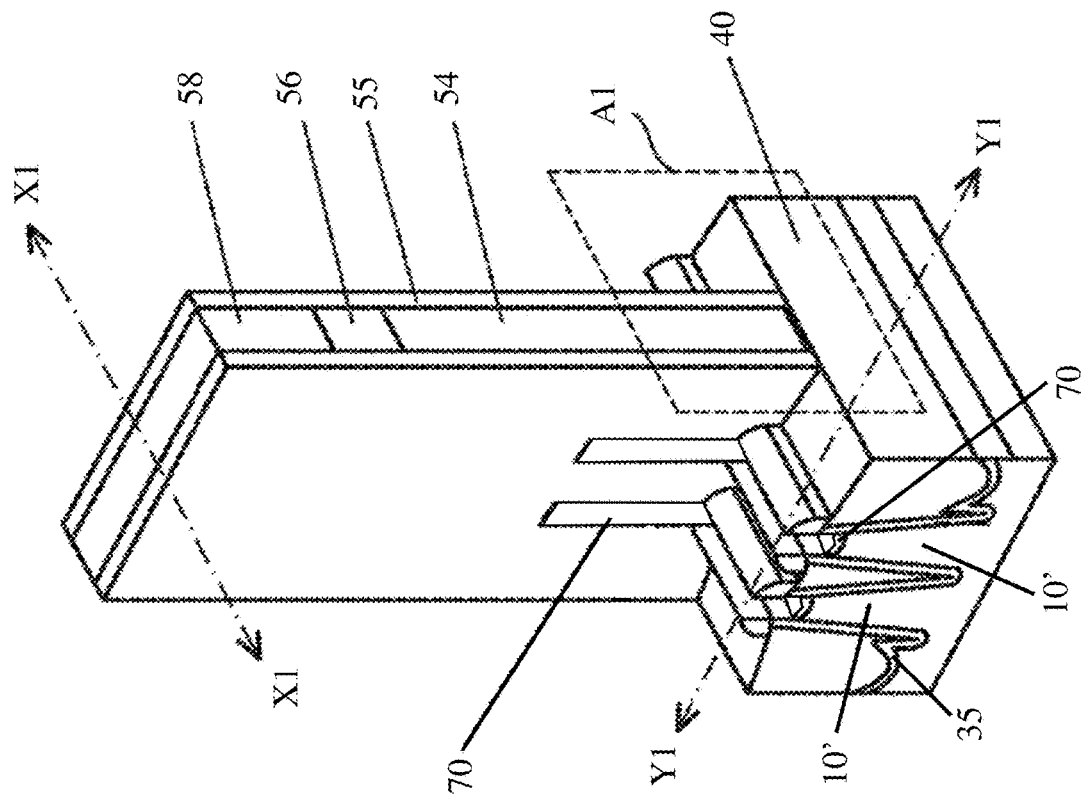
Figure 13A:
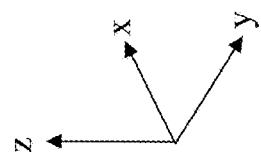
Figure 13C:
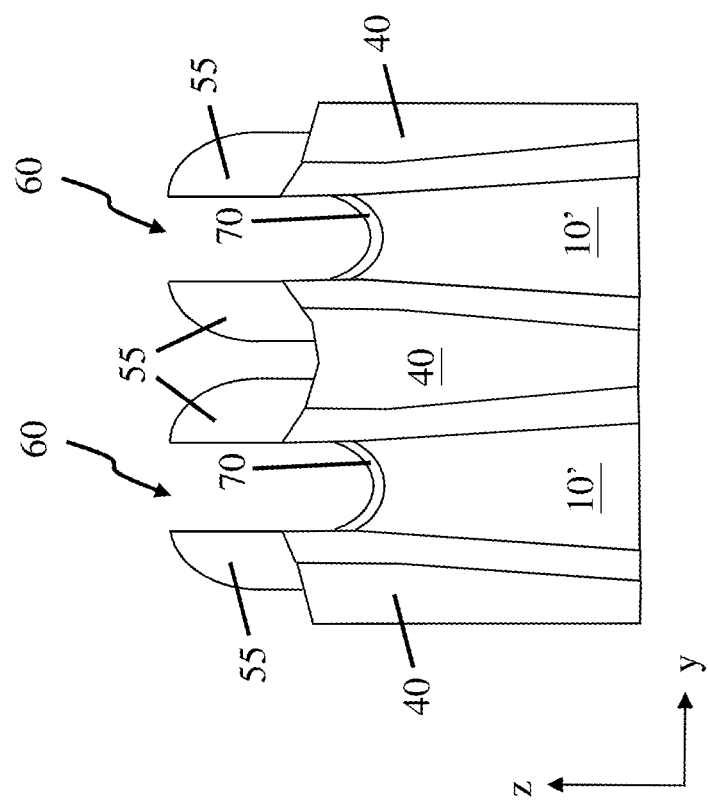
Figure 13B:
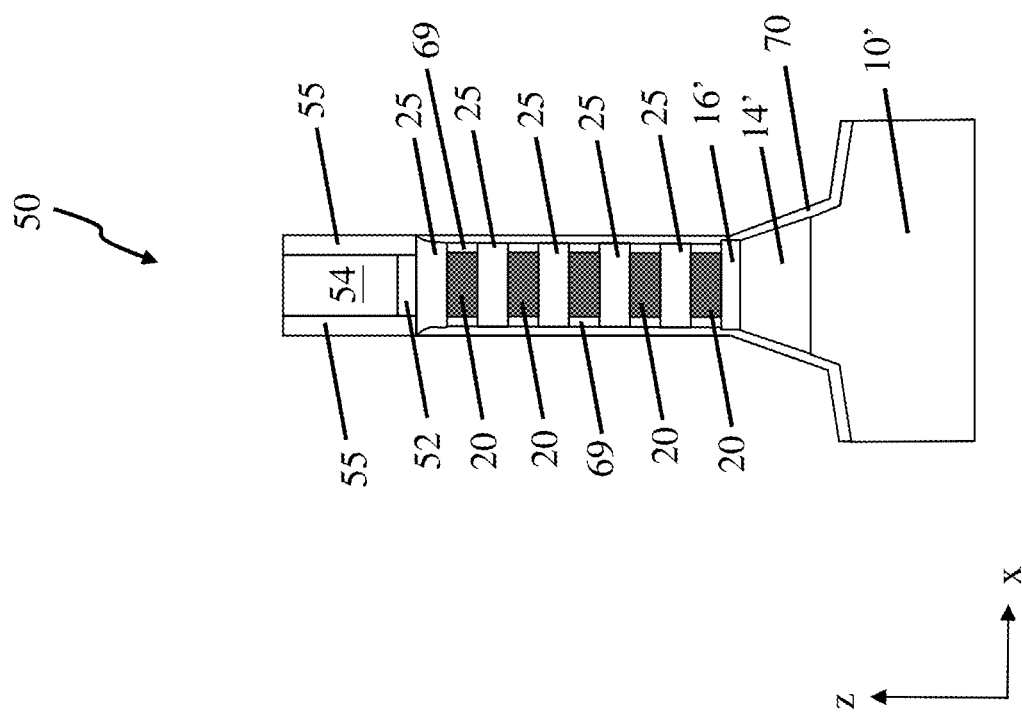

After the first semiconductor layers 20 are horizontally recessed, an inner spacer 69 is formed on the recessed surfaces of the first semiconductor layers 20, as shown in FIGS. 13A-13C. The inner spacer 69 is formed by conformally forming an insulating layer on etched lateral ends of the first and second semiconductor layers 20, 25 and over the sacrificial gate structure 50. The insulating layer includes one or more of silicon nitride and silicon oxide, SiON, SiOC, SiCN and SiOCN, or any other suitable dielectric material. The insulating layer of the inner spacer 69 is made of a different material than the sidewall spacers 55. The insulating layer can be formed by ALD or any other suitable methods. After the insulating layer is formed, an etching operation is performed to partially remove the insulating layer, thereby forming inner spacers 69, as shown in FIG. 13B. The inner spacer 69 has a thickness in a range from about 1.0 nm to about 10.0 nm. In other embodiments, the inner spacer 69 has a thickness in a range from about 2.0 nm to about 5.0 nm.

As shown in FIGS. 13A-13C, in some embodiments, a liner epitaxial layer 70 is also formed on the sidewalls of the inner spacer 69 and the recessed surfaces of the second semiconductor layers 25. The liner epitaxial layer 70 is employed to optimize transistor short channel effect and performance. The liner epitaxial layer 70 is also formed on the recessed fin structure 11 at the S/D regions. In some embodiments, the liner epitaxial layer 70 is selectively grown on the semiconductor layers and includes undoped silicon. In other embodiments, the liner epitaxial layer includes one or more layers of Si, SiP and SiCP. In certain embodiments, the liner epitaxial layer 70 includes one or more layers of SiGe and Ge. The thickness of the liner epitaxial layer 70 on the recessed surface of the first semiconductor layers 20 may be in a range from about 5 nm to about 10 nm. The thickness of the liner epitaxial layer 70 on the recessed surface of the second semiconductor layers 25 may be in a range from about 1 nm to about 4 nm. The thickness of the liner epitaxial layer 70 on the recessed surface of the second semiconductor layers 25 is about 20% to about 60% of the thickness of the liner epitaxial layer 70 on the recessed surface of the first semiconductor layers 20.

Figure 14:
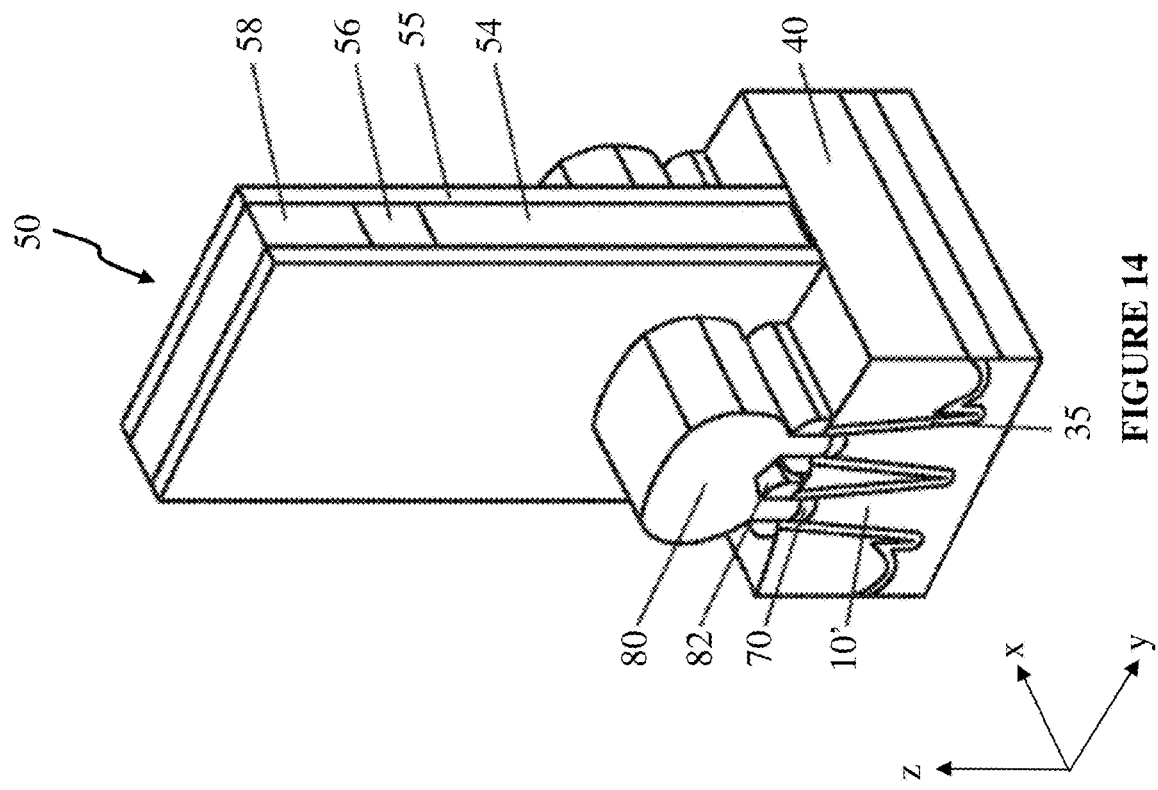

After the liner epitaxial layer 70 is formed, source/drain (S/D) epitaxial layers 80 are formed, as shown in FIG. 14. The S/D epitaxial layer 80 includes one or more layers of Si, SiP, SiC and SiCP for an n-channel FET or Si, SiGe, Ge for a p-channel FET. The S/D layers 80 are formed by an epitaxial growth method using CVD, ALD or molecular beam epitaxy (MBE). As shown in FIG. 14, the S/D epitaxial layers grow from the liner layers 70 formed on respective surfaces of bottoms 11 of two fin structures. The grown epitaxial layers merge above the isolation insulating layer and form a void 82 in some embodiments. The S/D layers 80 and the liner epitaxial layer 70 collectively form the S/D features of the GAA FET device.

Figure 15:
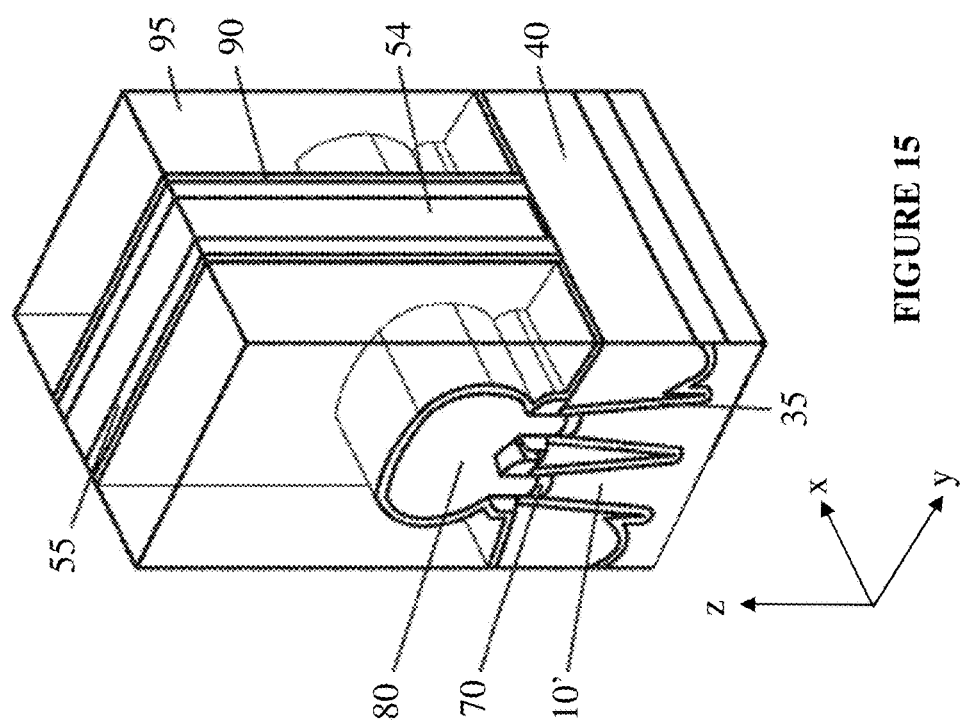

Subsequently, a second liner layer 90 is formed and then an interlayer dielectric (ILD) layer 95 is formed, as shown in FIG. 15. The second liner layer 90 includes a silicon nitride-based material, such as SiN, and functions as a contact etch stop layer in the subsequent etching operations. The materials for the ILD layer 95 include compounds that include Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer 54 is exposed.

Figure 16:
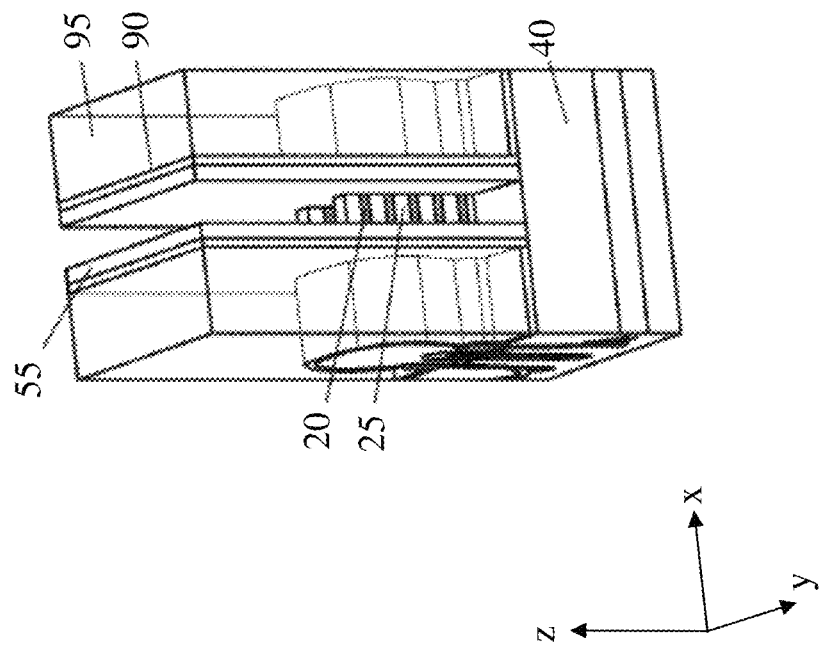

Next, as shown in FIG. 16, the sacrificial gate electrode layer 54 and sacrificial gate dielectric layer 52 are removed, thereby exposing the fin structures. The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 17B:
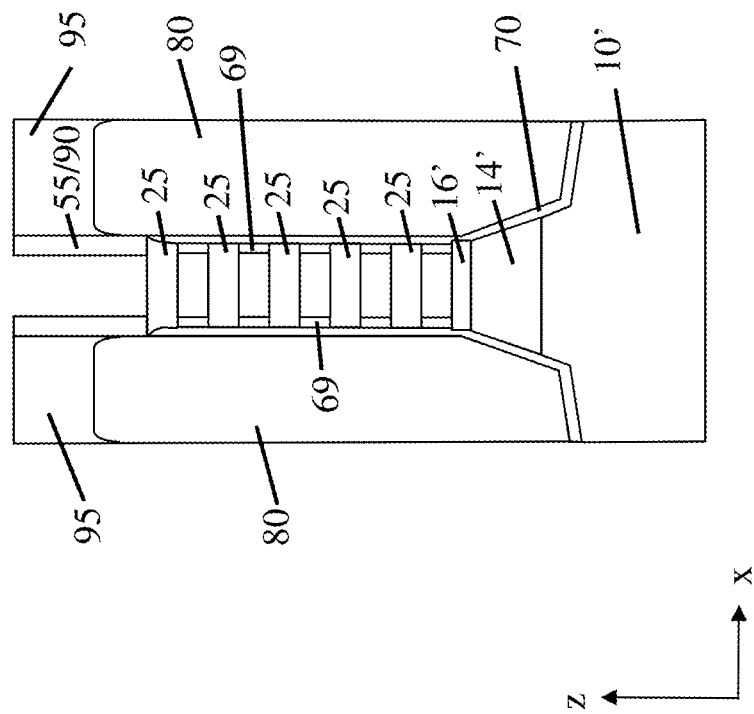
Figure 17A:
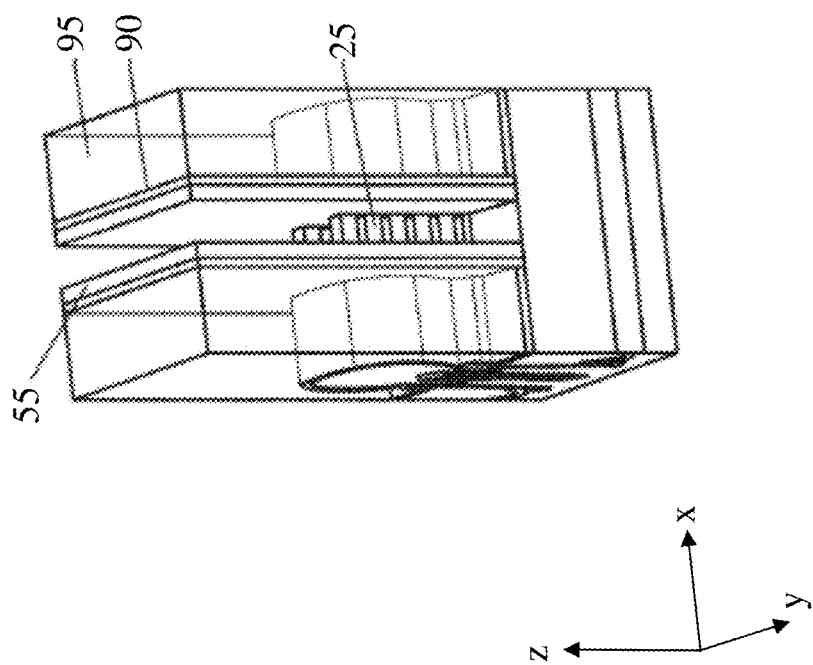

After the sacrificial gate structures are removed, the first semiconductor layers 20 in the fin structures are removed, thereby forming semiconductor channel layers of the second semiconductor layers 25, as shown in FIGS. 17A and 17B in which FIG. 17B is the cross-sectional view along the fin structure. This step of removing the first semiconductor layers 20 may also be referred to as a wire release step or a sheet formation step (e.g. nanosheet formation step). The first semiconductor layers 20 can be removed or etched using an etchant that can selectively etch the first semiconductor layers 20 relative to the second semiconductor layers 25. When the first semiconductor layers 20 include Ge or SiGe and the second semiconductor layers 25 include Si, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. On the other hand, when the first semiconductor layers 20 include Si and the second semiconductor layers 25 include Ge or SiGe, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 18:
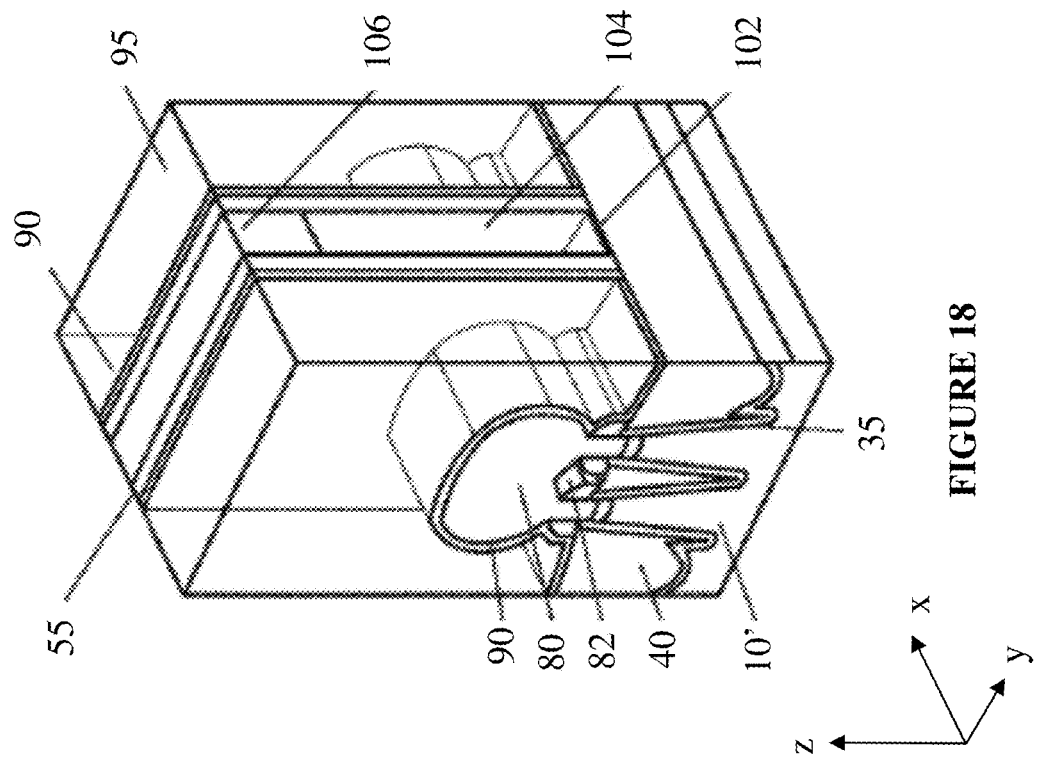

In the present embodiment, since the liner epitaxial layer 70 (e.g., Si) is formed, the etching of the first semiconductor layers 20 (e.g., SiGe) stops at the liner epitaxial layer 70. When the first semiconductor layers 20 include Si, the liner epitaxial layer 70 can include SiGe or Ge. Since the etching of the first semiconductor layers 20 stops at the liner epitaxial layer 70, it is possible to prevent the gate electrode and the S/D epitaxial layer from contacting or bridging. After the semiconductor channel layers of the second semiconductor layers 25 are formed, a gate dielectric layer 102 is formed around each semiconductor channel layer 25 and a gate electrode layer 104 is formed on the gate dielectric layer 102, as shown in FIG. 18.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 may be in a range from about 1 nm to about 6 nm in one embodiment.

The gate electrode layer 104 is formed on the gate dielectric layer 102 to surround each channel layers. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode layer 104 is recessed and a cap insulating layer 106 is formed over the recessed gate electrode 104, as shown in FIG. 18. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 19:
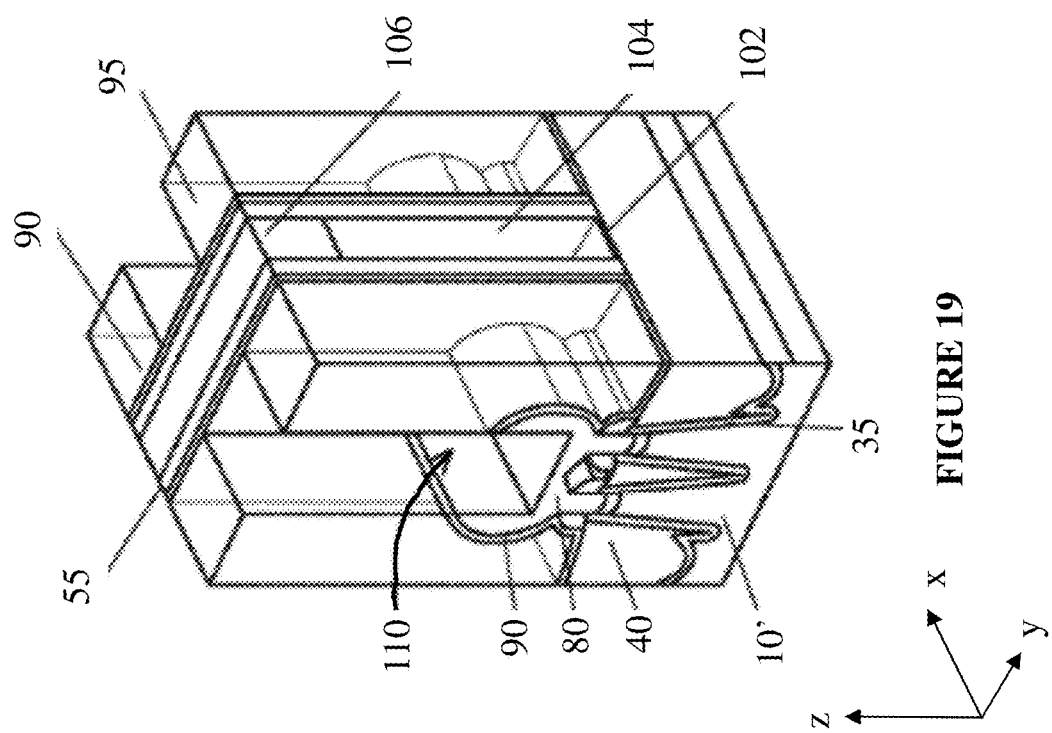
Figure 20:
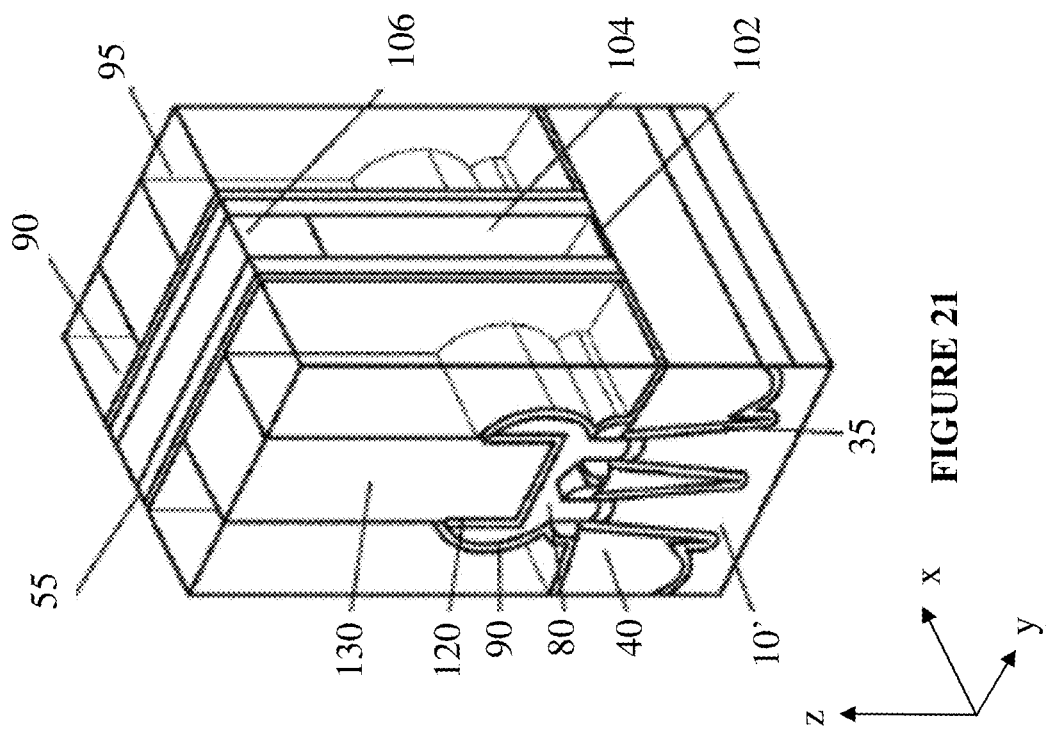
Figure 21:
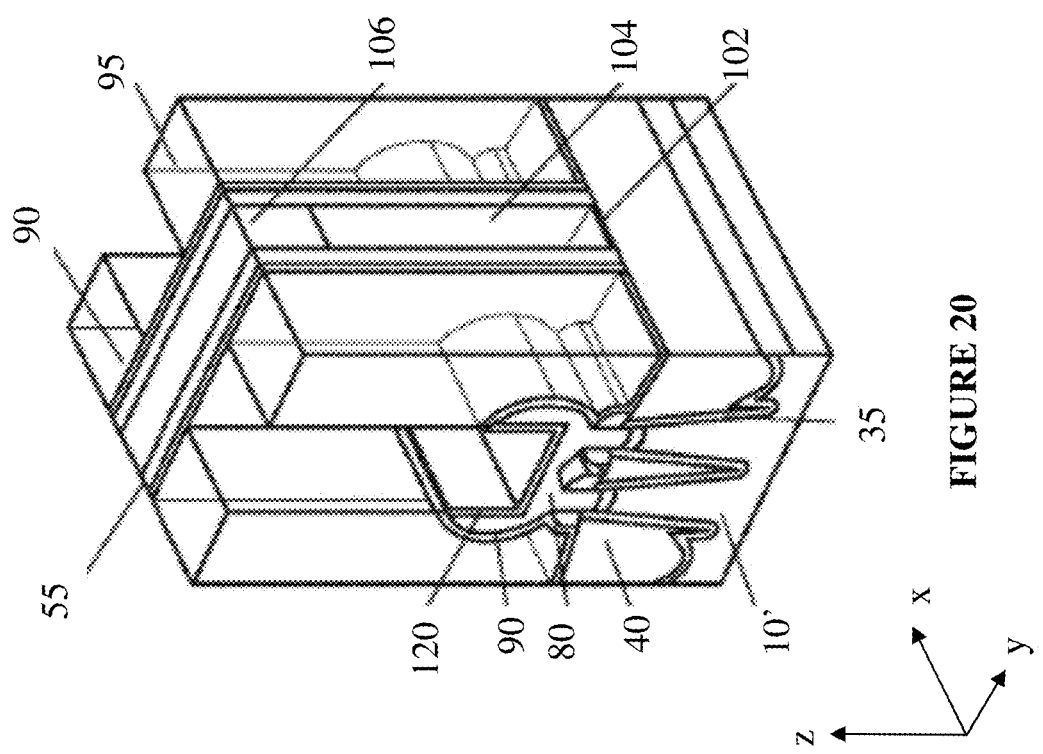

Subsequently, contact holes 110 are formed in the ILD layer 95 by using dry etching, as shown in FIG. 19. In some embodiments, the upper portion of the S/D epitaxial layer 80 is etched. A silicide layer 120 is formed over the S/D epitaxial layer 80, as shown in FIG. 20. The silicide layer includes one or more of WSi, CoSi, NiSi, TiSi, MoSi and TaSi. Then, a conductive material 130 is formed in the contact holes as shown in FIG. 21. The conductive material 130 includes one or more of Co, Ni. W, Ti, Ta, Cu, Al, TiN and TaN.

Figure 22C:
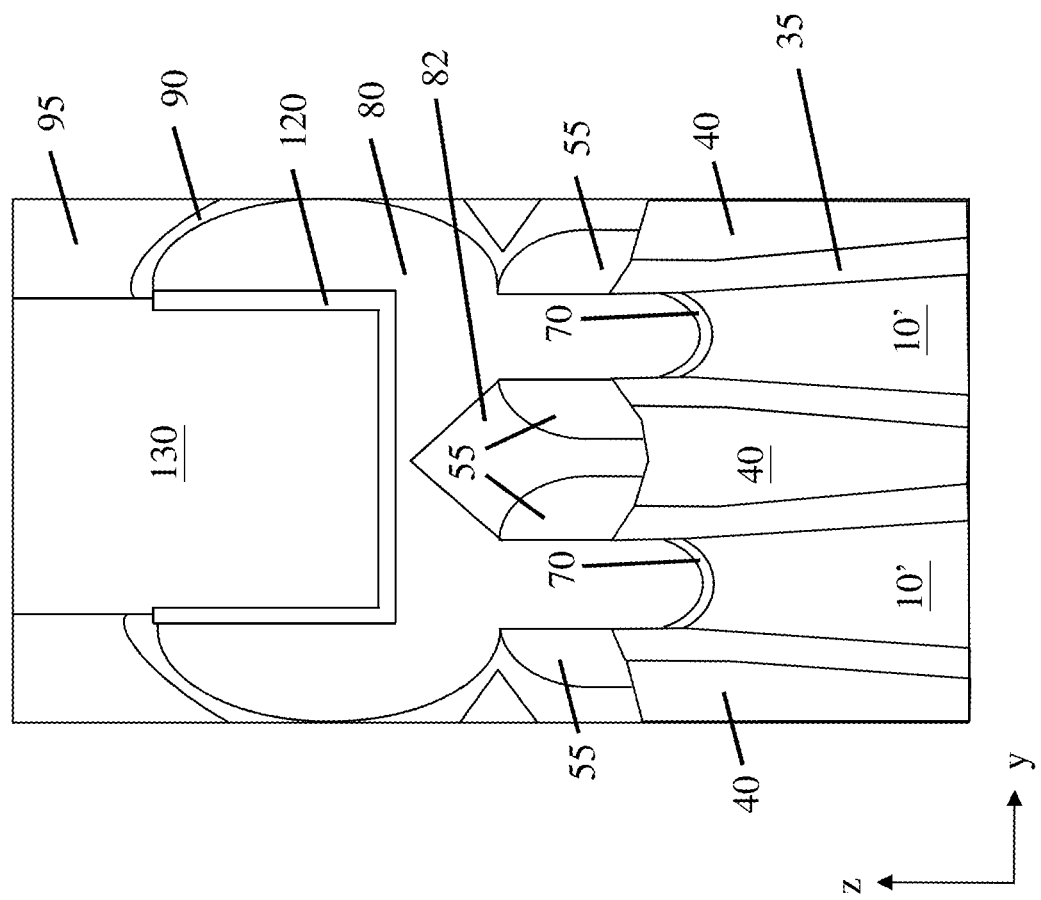

FIGS. 22A-22C show cross sectional views of the structure of FIG. 21. FIG. 22A shows the cross-sectional view cutting the gate structure along the Y direction, FIG. 22B shows the cross-sectional view cutting the gate structure along the X direction, and FIG. 22C shows the cross-sectional view cutting the S/D region along the Y direction.

As shown in FIG. 22A, the semiconductor channel layers made of the second semiconductor layer 25 are stacked in the Z direction. The semiconductor channel layers may also be referred to as a multi-bridge channel, a plurality of nanoslabs, a plurality of nanosheets, a plurality of wires (e.g. having a round, square, hexagonal, or other cross-sectional shape). It is noted that the second semiconductor layers 25 may also be etched when the first semiconductor layer 20 are removed, and thus the corners of the second semiconductor layers 25 are rounded. An interfacial layer 102A wraps around each of the wires, and the gate dielectric layer 102B covers the interfacial layer 102A. Although the gate dielectric layer 120B wrapping around one wire is in contact with that of the adjacent wire in FIG. 22A, the structure is not limited to FIG. 22A. In other embodiments, the gate electrode 104 also wraps around each of the wires covered by the interfacial layer 102A and the gate dielectric layer 102B.

As shown in FIG. 22B, the liner epitaxial layer 70 is formed between the S/D epitaxial layer 80 and the wires (second semiconductor layers 25). The thickness T1 of the liner epitaxial layer 70 at the portion between the wires is in a range from about 5 nm to about 10 nm, the thickness T2 of the recessing of the liner epitaxial layer 70 at the ends of the wires is in a range from about 1 nm to about 4 nm, in some embodiments. The difference T3 of the thickness T1 and the thickness T2 is in a range from about 1 nm to about 9 nm, in some embodiments. The thickness T2 is about 20% to about 60% of the thickness T1 in certain embodiments and is about less than 40% in other embodiments.

Figure 23B:
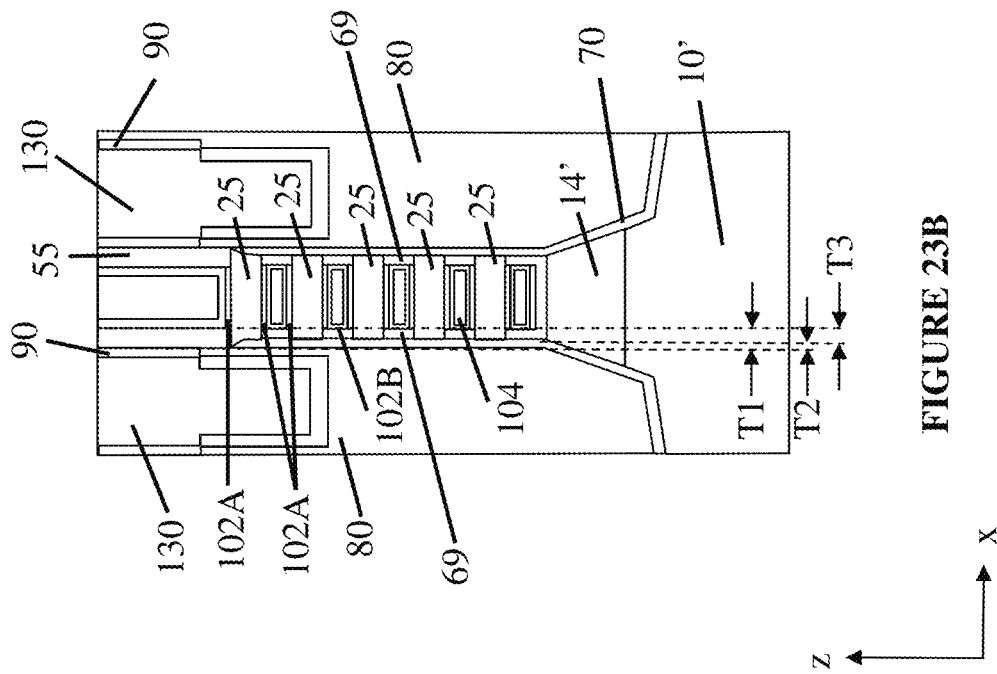
FIGS. 23A to 23C show a GAA FET device, according to another embodiment of the present disclosure.
Figure 23A:
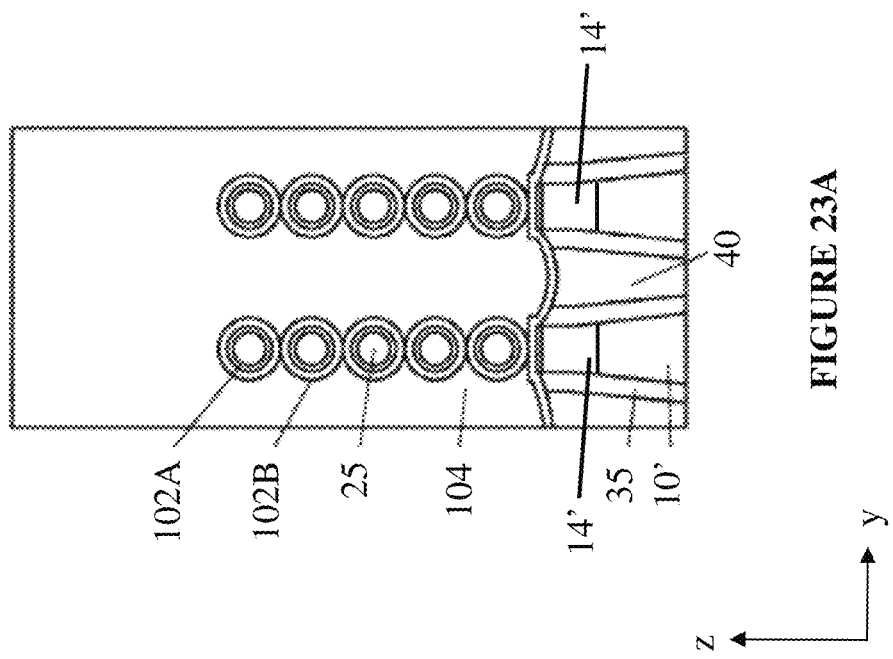
Figure 23C:
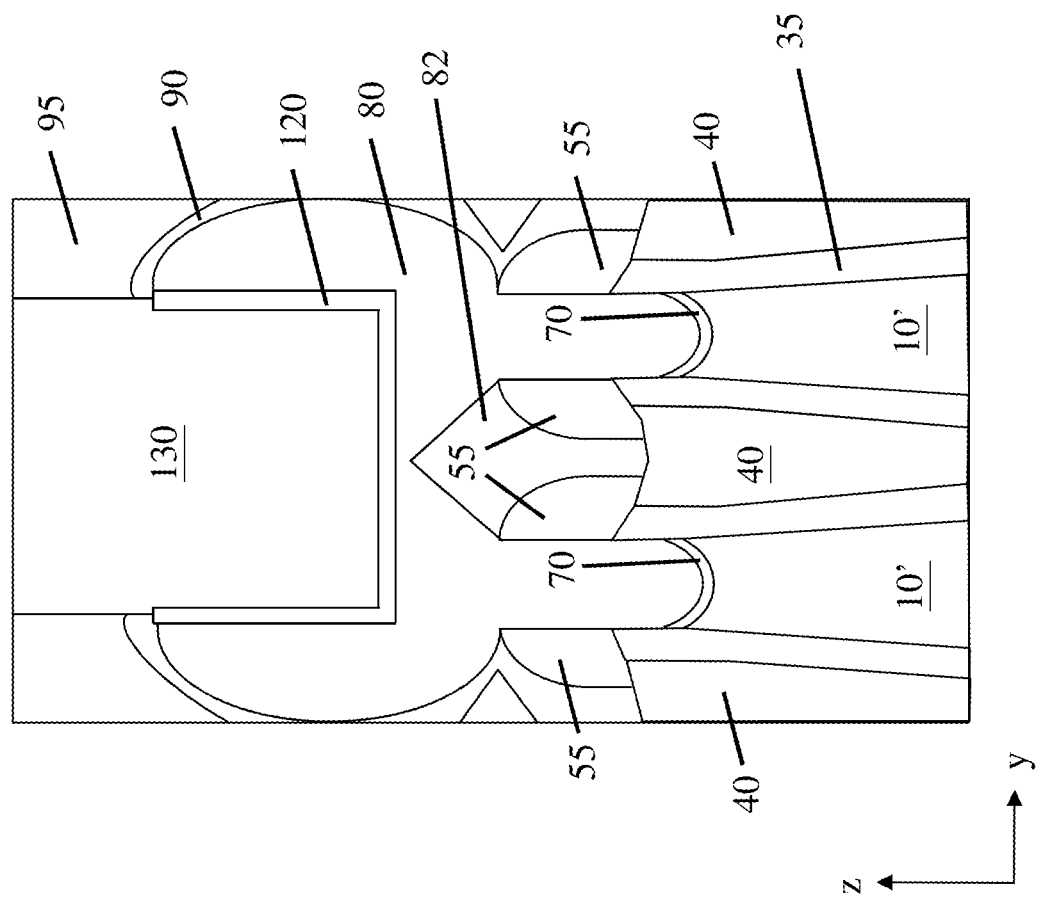

In the embodiment process shown in FIGS. 1 to 22C, the GAA FET includes the patterned insulating layer 14' and the patterned semiconductor-containing layer 16' (e.g. SOI substrate). However, in other embodiments, the patterned semiconductor-containing layer 16' (e.g. SOI substrate) may be omitted. In such embodiments, such as in the example shown in FIGS. 23A to 23C, the resultant GAA FET includes the patterned insulating layer 14' but is devoid of the patterned semiconductor-containing layer 16' (e.g. SOI substrate). In either embodiment, the resultant GAA FET offers several advantages. For example, the present disclosure is directed to, but not otherwise limited to, a multi-gate field effect transistor (FET), an example being a gate-all-around (GAA) FET. In a GAA FET, multiple semiconductor channel layers are vertically suspended over an underlying semiconductor substrate. A gate structure (including a gate electrode layer and a gate dielectric layer) is formed in the space between vertically adjacent semiconductor channel layers. Embodiments of the present disclosure provide for at least one insulating layer that is interposed between the bottommost gate structure and the underlying semiconductor substrate, where the bottommost gate structure is the gate structure in closest proximity to the underlying semiconductor substrate. The presence of the at least one insulating layer between the bottommost gate structure and the underlying semiconductor substrate reduces leakage current in the GAA FET, minimizes a size of a parasitic PN junction between the semiconductor substrate and the source/drain regions of the GAA FET, and improves the $I_{ON}/I_{OFF}$ ratio of the GAA FET.

It is understood that the GAA FETs undergoes further CMOS processes to form various features such as contacts/vias, interconnect metal layers, dielectric layers, passivation layers, etc.

Figure 24:
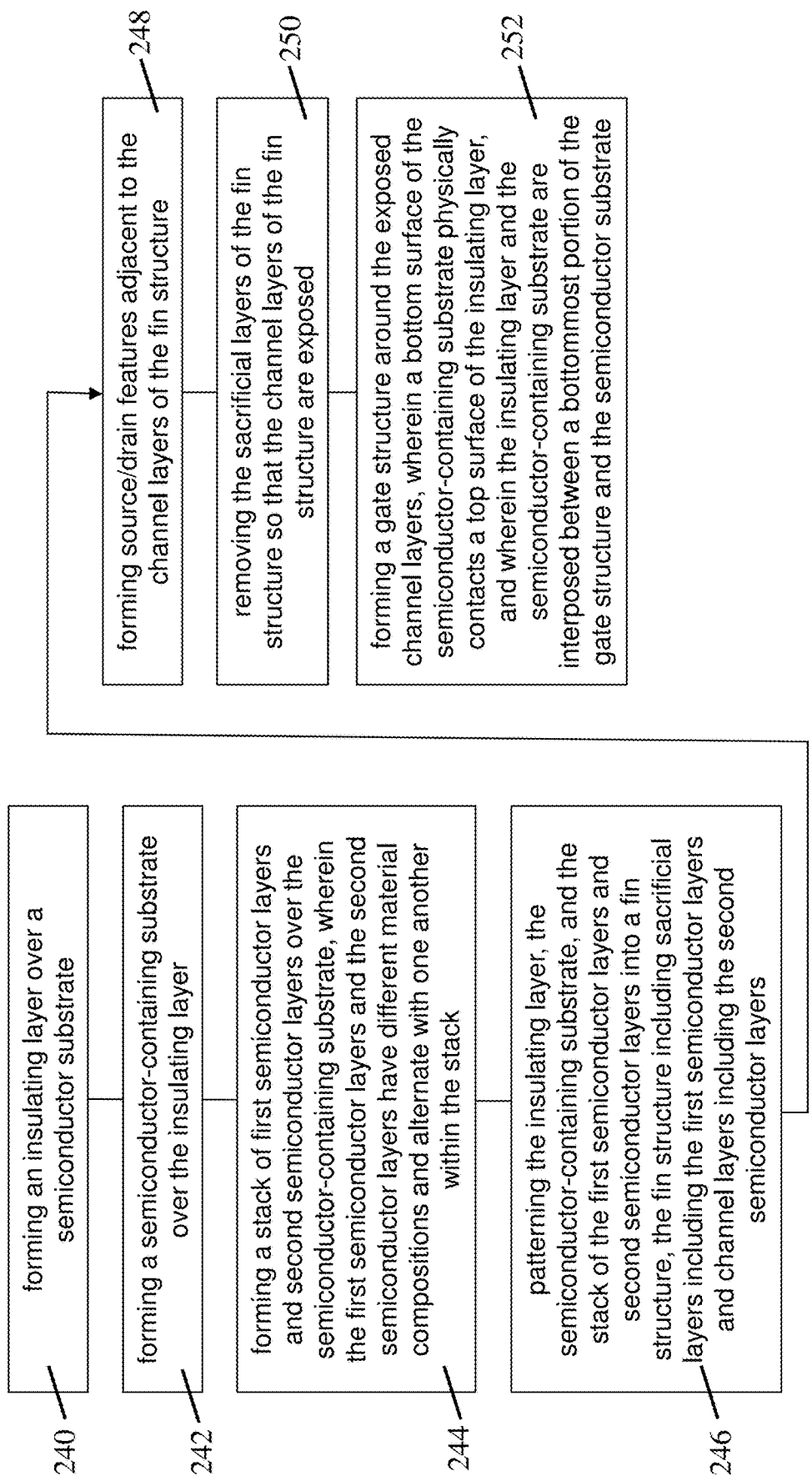
FIG. 24 shows a process flow illustrating a method of manufacturing a GAA FET device, according to an embodiment of the present disclosure.

FIG. 24 shows a method of forming a multi-gate field effect transistor in accordance with an embodiment of the present disclosure. As seen in FIG. 24, the method includes operation 240 of forming an insulating layer over a semiconductor substrate and operation 242 of forming a semiconductor-containing substrate over the insulating layer. The method further includes operation 244 of forming a stack of first semiconductor layers and second semiconductor layers over the semiconductor-containing substrate, wherein the first semiconductor layers and the second semiconductor layers have different material compositions and alternate with one another within the stack. Operation 246 of the method shown in FIG. 24 includes patterning the insulating layer, the semiconductor-containing substrate, and the stack of the first semiconductor layers and second semiconductor layers into a fin structure, the fin structure including sacrificial layers including the first semiconductor layers and channel layers including the second semiconductor layers. The method also includes operation 248 of forming source/drain features adjacent to the channel layers of the fin structure and operation 250 of removing the sacrificial layers of the fin structure so that the channel layers of the fin structure are exposed. Operation 252 of the method shown in FIG. 24 includes forming a gate structure around the exposed channel layers, wherein a bottom surface of the semiconductor-containing substrate physically contacts a top surface of the insulating layer, and wherein the insulating layer and the semiconductor-containing substrate are interposed between a bottommost portion of the gate structure and the semiconductor substrate.

In one example aspect, the present disclosure provides a method of semiconductor fabrication. The method includes: forming a dielectric-containing substrate over a semiconductor substrate; forming a stack of first semiconductor layers and second semiconductor layers over the dielectric-containing substrate, wherein the first semiconductor layers and the second semiconductor layers have different material compositions and alternate with one another within the stack; patterning the first semiconductor layer and the second semiconductor layers into a fin structure such that the fin structure includes sacrificial layers including the second semiconductor layers and channel layers including the first semiconductor layers; forming source/drain features adjacent to the sacrificial layers and the channel layers; removing the sacrificial layers of the fin structure so that the channel layers of the fin structure are exposed; and forming a gate structure around the exposed channel layers, wherein the dielectric-containing substrate is interposed between the gate structure and the semiconductor substrate.

In another example aspect, the present disclosure provides a method of semiconductor fabrication. The method includes: forming a dielectric-containing substrate over a semiconductor substrate; forming first semiconductor layers sandwiching a second semiconductor layer in a first direction over the semiconductor substrate; patterning the first semiconductor layers and the second semiconductor layer into a fin structure such that the fin structure includes sacrificial layers including the first semiconductor layers and a channel layer including the second semiconductor layer; forming a sacrificial gate structure over the fin structure such that the sacrificial gate structure covers a part of the fin structure while remaining parts of the fin structure remains exposed; removing the remaining parts of the fin structure;

forming an inner spacer at least on the recessed surface of the sacrificial layers; forming a source/drain region adjacent to the inner spacer and the channel layer; removing the sacrificial gate structure; removing the sacrificial layers in the fin structure after removing the sacrificial gate structure so that the channel layer is exposed and is suspended over the dielectric-containing substrate; and forming a gate dielectric layer and a gate electrode layer around the exposed channel layer, wherein a bottom surface of the dielectric-containing substrate physically contacts a top surface of the semiconductor substrate, and wherein the gate dielectric layer and the gate electrode layer are disposed between the dielectric-containing substrate and the channel layer in the first direction.

In another example aspect, the present disclosure provides a semiconductor device. The semiconductor device includes: a dielectric-containing substrate disposed over a semiconductor substrate; channel layers vertically suspended over the dielectric-containing substrate, a bottommost channel layer being vertically separated from the dielectric-containing substrate by a space; a first source/drain region disposed over the semiconductor substrate and contacting first ends of the channel layers; a second source/drain region disposed over the semiconductor substrate and contacting second ends of the channel layers; a gate dielectric layer disposed on and wrapping each of the channel layers; and a gate electrode layer disposed on the gate dielectric layer and wrapping each of the channel layers, wherein the gate dielectric layer and the gate electrode layer wrapping the bottom-most channel layer is located in the space between the dielectric-containing substrate and the bottom-most channel layer, the dielectric-containing substrate physically contacting the semiconductor substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an insulating layer over a semiconductor substrate;
    forming a semiconductor-containing substrate over the insulating layer;
    forming a stack of first semiconductor layers and second semiconductor layers over the semiconductor-containing substrate, wherein the first semiconductor layers and the second semiconductor layers have different material compositions and alternate with one another within the stack;
    patterning the insulating layer, the semiconductor-containing substrate, and the stack of the first semiconductor layers and second semiconductor layers into a fin structure, the fin structure including sacrificial layers including the first semiconductor layers and channel layers including the second semiconductor layers;
    forming source/drain features adjacent to the channel layers of the fin structure;
    removing the sacrificial layers of the fin structure so that the channel layers of the fin structure are exposed; and
    forming a gate structure around the exposed channel layers, wherein a bottom surface of the semiconductor-containing substrate physically contacts a top surface of the insulating layer, and wherein the insulating layer and the semiconductor-containing substrate are interposed between a bottommost portion of the gate structure and the semiconductor substrate.

2. The method of claim 1, wherein semiconductor-containing substrate includes a semiconductor-on-insulator (SOI) substrate.

3. The method of claim 2, wherein a dielectric layer of the SOI substrate has a composition that is different from the insulating layer.

4. The method of claim 1, wherein the insulating layer includes a material selected from the group consisting of silicon oxide, silicon nitride, silicon oxynitride, silicon oxycarbonitride, silicon carbon nitride, fluorine-doped silicate glass, and combinations thereof.

5. The method of claim 1, wherein bottom portions of the source/drain features physically contact sidewalls of the insulating layer and the semiconductor-containing substrate.

6. The method of claim 1, wherein a first one of the source/drain features is laterally separated from a second one of the source/drain features by a separation distance, and wherein a thickness of the semiconductor-containing substrate is in a range from about 0.4 times the separation distance to about 0.6 times the separation distance.

7. The method of claim 6, wherein the separation distance is a gate length of a transistor device including the fin structure and the gate structure.

8. The method of claim 1, wherein forming source/drain features adjacent to the channel layers of the fin structure includes:
    forming a sacrificial gate structure over the fin structure such that the sacrificial gate structure covers a first part of the fin structure while second parts of the fin structure remain exposed;
    removing the second parts of the fin structure that are not covered by the sacrificial gate structure, removing exposing portions of the semiconductor substrate;
    horizontally recessing the sacrificial layers so that edges of the sacrificial layers are located below the sacrificial gate structure;
    forming an inner spacer on the recessed surface of the sacrificial layers;
    forming a liner epitaxial layer over the exposed portions of the semiconductor substrate; and
    forming the source/drain features over the liner epitaxial layer.

9. The method of claim 8, wherein the liner epitaxial layer includes undoped silicon.

10. A method, comprising:
    forming a dielectric-containing substrate over a semiconductor substrate;
    forming first semiconductor layers sandwiching a second semiconductor layer in a first direction over the dielectric-containing substrate;
    patterning the first semiconductor layers, the second semiconductor layer, and the dielectric-containing substrate into a fin structure such that the fin structure includes sacrificial layers including the first semiconductor layers and a channel layer including the second semiconductor layer;

forming a sacrificial gate structure over the fin structure such that the sacrificial gate structure covers a part of the fin structure while remaining parts of the fin structure remains exposed;

removing the remaining parts of the fin structure;

forming an inner spacer at least on a recessed surface of the sacrificial layers;

forming a source/drain region adjacent to the inner spacer and the channel layer;

removing the sacrificial gate structure;

removing the sacrificial layers in the fin structure after removing the sacrificial gate structure so that the channel layer is exposed and is suspended over the dielectric-containing substrate; and forming a gate dielectric layer and a gate electrode layer around the exposed channel layer, wherein a bottom surface of the dielectric-containing substrate physically contacts a top surface of the semiconductor substrate, and wherein the gate dielectric layer and the gate electrode layer are disposed between the dielectric-containing substrate and the channel layer in the first direction.

11. The method of claim 10, wherein the dielectric-containing substrate includes a first layer and a second layer over the first layer, the first layer physically contacting the semiconductor substrate, the first layer and the second layer having different compositions.

12. The method of claim 11, wherein the first layer includes a material selected from the group consisting of silicon oxide, silicon nitride, silicon oxynitride, silicon oxycarbonitride, silicon carbon nitride, fluorine-doped silicate glass, and combinations thereof.

13. The method of claim 11, wherein the second layer includes a semiconductor-on-insulator (SOI) substrate.

14. The method of claim 11, wherein a thickness of the second layer in the first direction is in a range from about 0.4 times a dimension of the gate electrode layer in a second direction to about 0.6 times the dimension of the gate electrode layer in the second direction, the second direction being perpendicular to the first direction.

15. The method of claim 11, wherein a thickness of the second layer in the first direction is in a range from about 3 nanometers to about 7 nanometers.

16. The method of claim 10, wherein the inner spacer includes a material selected from the group consisting of silicon nitride and silicon oxide, SiION, SiOC, SiCN, SiOCN, and combinations thereof.

17. A semiconductor device, comprising:
a dielectric-containing substrate disposed over a semiconductor substrate, wherein the dielectric-containing substrate includes a semiconductor surface;
channel layers vertically suspended over the dielectric-containing substrate, a bottom-most channel layer being vertically separated from the dielectric-containing substrate by a space;
a first source/drain region disposed over the semiconductor substrate and contacting first ends of the channel layers;
a second source/drain region disposed over the semiconductor substrate and contacting second ends of the channel layers;
a gate dielectric layer disposed on and wrapping each of the channel layers; and
a gate electrode layer disposed on the gate dielectric layer and wrapping each of the channel layers, wherein a portion of the gate dielectric layer and the gate electrode layer wrapping the bottom-most channel layer is located in the space between the dielectric-containing substrate and the bottom-most channel layer and physically contacts the semiconductor surface of the dielectric-containing substrate, the dielectric-containing substrate physically contacting the semiconductor substrate.

18. The semiconductor device of claim 17, wherein the dielectric-containing substrate includes a first material selected from the group consisting of silicon oxide, silicon nitride, silicon oxynitride, silicon oxycarbonitride, silicon carbon nitride, fluorine-doped silicate glass, and combinations thereof.

19. The semiconductor device of claim 18, wherein the dielectric-containing substrate further includes a semiconductor-on-insulator (SOI) substrate disposed on and physically contacting the first material.

20. The semiconductor device of claim 17, wherein the channel layers include Si or a Si-based compound.

* * * * *